US011152476B2

(12) United States Patent
Nakayama et al.

(10) Patent No.: US 11,152,476 B2
(45) Date of Patent: Oct. 19, 2021

(54) METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Masanori Nakayama, Toyama (JP); Yuichiro Takeshima, Toyama (JP); Hiroto Igawa, Toyama (JP); Katsunori Funaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/125,279

(22) Filed: Sep. 7, 2018

(65) Prior Publication Data

US 2019/0006481 A1   Jan. 3, 2019

Related U.S. Application Data

(63) Continuation of application No. PCT/JP2016/078214, filed on Sep. 26, 2016.

(30) Foreign Application Priority Data

Mar. 11, 2016   (JP) .............................. JP2016-047993

(51) Int. Cl.
*H01L 21/00* (2006.01)
*H01L 29/423* (2006.01)
(Continued)

(52) U.S. Cl.
CPC .. *H01L 29/42344* (2013.01); *H01L 21/02252* (2013.01); *H01L 21/02315* (2013.01);
(Continued)

(58) Field of Classification Search
CPC ......... H01L 21/02252; H01L 21/02315; H01L 21/28282; H01L 21/3211; H01L 27/115;
(Continued)

(56) References Cited

U.S. PATENT DOCUMENTS

| 4,870,245 A | * | 9/1989 | Price | H01J 37/32091 |
| | | | | 219/121.36 |
| 5,858,844 A | * | 1/1999 | Fang | H01L 21/28114 |
| | | | | 257/E21.205 |

(Continued)

FOREIGN PATENT DOCUMENTS

| JP | 59-136926 A | 8/1984 |
| JP | 2005-175488 A | 6/2005 |

(Continued)

OTHER PUBLICATIONS

Machine translation of JP 2005-175488, published Jun. 2005.*
Machine translation of JP 2014-075570, published Apr. 2014.*

*Primary Examiner* — Richard A Booth
(74) *Attorney, Agent, or Firm* — Edell, Shapiro & Finnan, LLC.

(57) ABSTRACT

Described herein is a technique capable of improving electrical characteristics of a polysilicon film while suppressing damage to an underlying silicon oxide film. According to the technique described herein, there is provided a there is provided a method of manufacturing a semiconductor device, including: (a) preparing a substrate including a silicon oxide film and a polysilicon film formed on the silicon oxide film, wherein the polysilicon film includes a contact surface contacting the silicon oxide film and an exposed surface facing the contact surface; and (b) supplying a reactive species generated by plasma excitation of a gas containing hydrogen and oxygen to the exposed surface of the polysilicon film.

17 Claims, 14 Drawing Sheets

(51) Int. Cl.
*H01L 21/28* (2006.01)
*H01L 21/321* (2006.01)
*H01L 29/66* (2006.01)
*H01L 27/115* (2017.01)
*H01L 29/792* (2006.01)
*H01L 21/02* (2006.01)

(52) U.S. Cl.
CPC ........ *H01L 21/3211* (2013.01); *H01L 27/115* (2013.01); *H01L 29/40117* (2019.08); *H01L 29/42364* (2013.01); *H01L 29/66765* (2013.01); *H01L 29/66833* (2013.01); *H01L 29/792* (2013.01)

(58) Field of Classification Search
CPC ......... H01L 29/42364; H01L 29/66833; H01L 29/786; H01L 29/792
See application file for complete search history.

(56) References Cited

U.S. PATENT DOCUMENTS

| | | | |
|---|---|---|---|
| 2010/0151694 A1* | 6/2010 | Peuse | H01L 21/0223 438/770 |
| 2010/0244119 A1 | 9/2010 | Fukuzumi et al. | |
| 2014/0106573 A1 | 4/2014 | Terasaki et al. | |
| 2014/0197416 A1 | 7/2014 | Qin et al. | |
| 2015/0206906 A1 | 7/2015 | Qin et al. | |
| 2017/0194151 A1* | 7/2017 | Zhang | H01L 21/26513 |

FOREIGN PATENT DOCUMENTS

| | | |
|---|---|---|
| JP | 2010-225946 A | 10/2010 |
| JP | 2014-075579 A | 4/2014 |

* cited by examiner

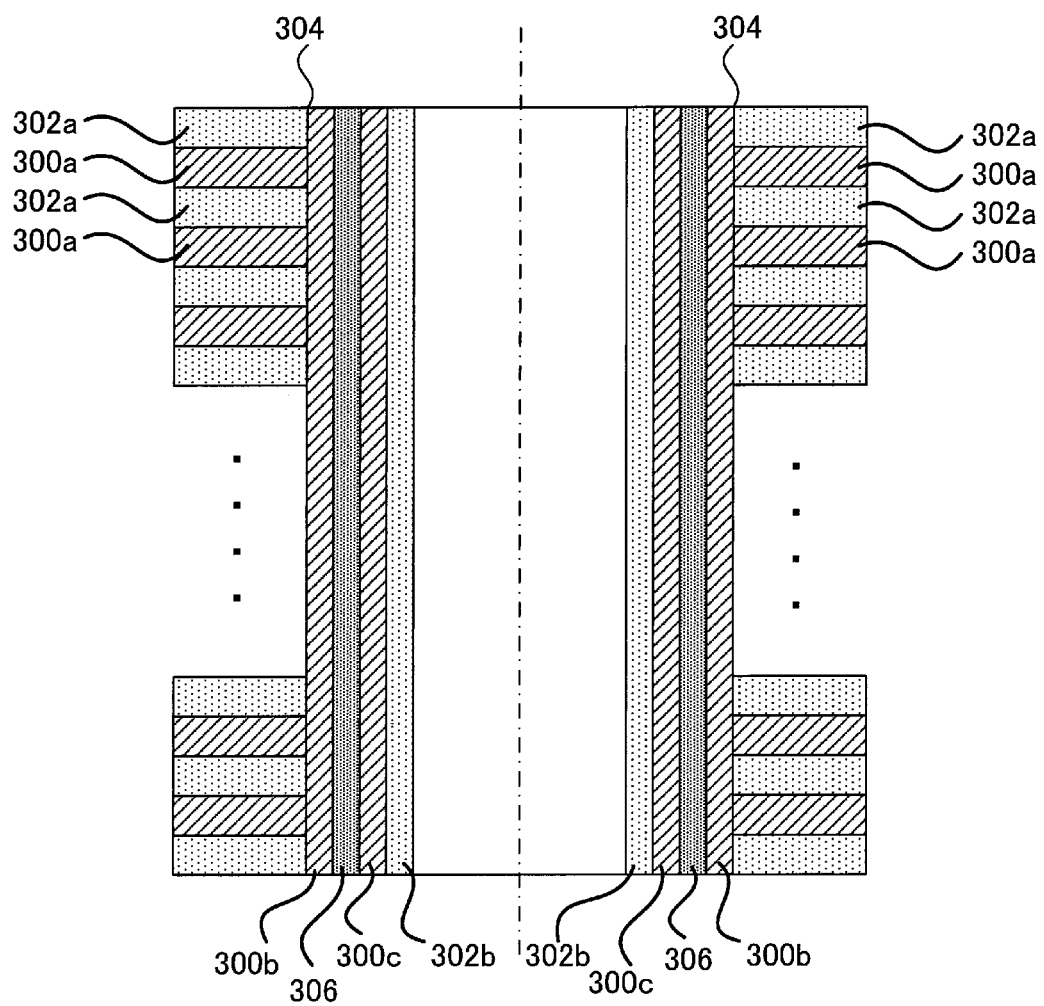

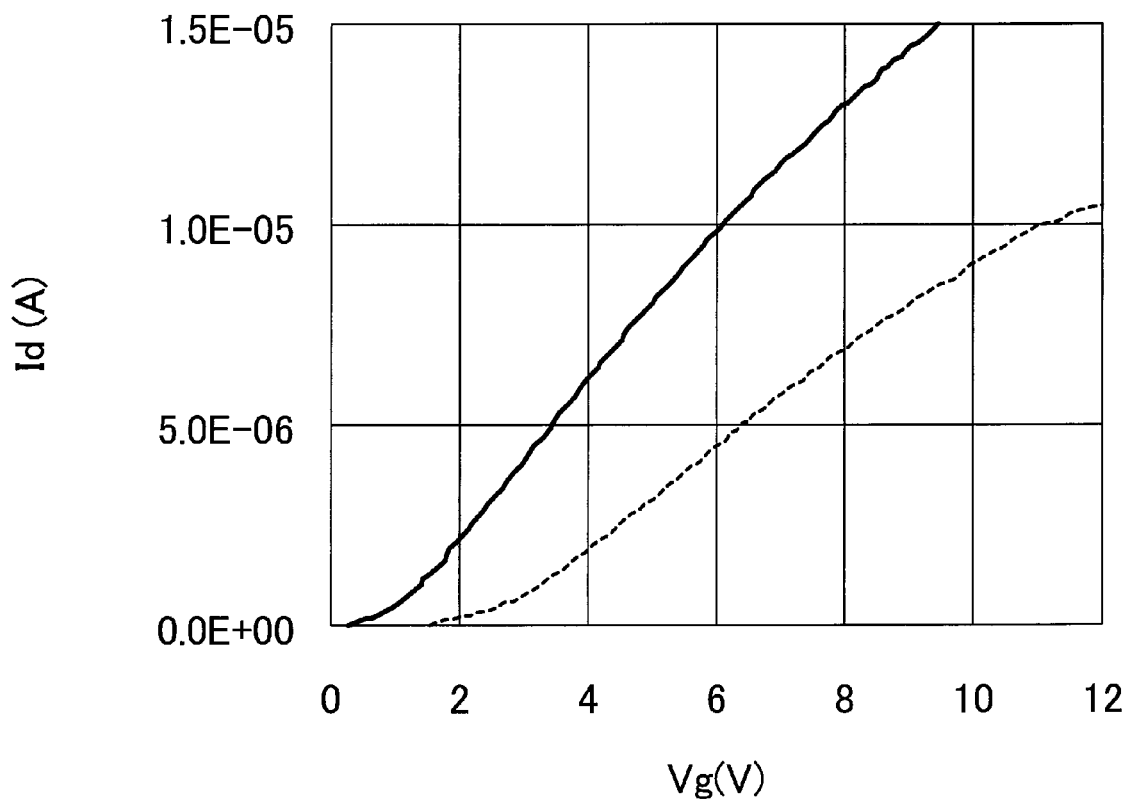

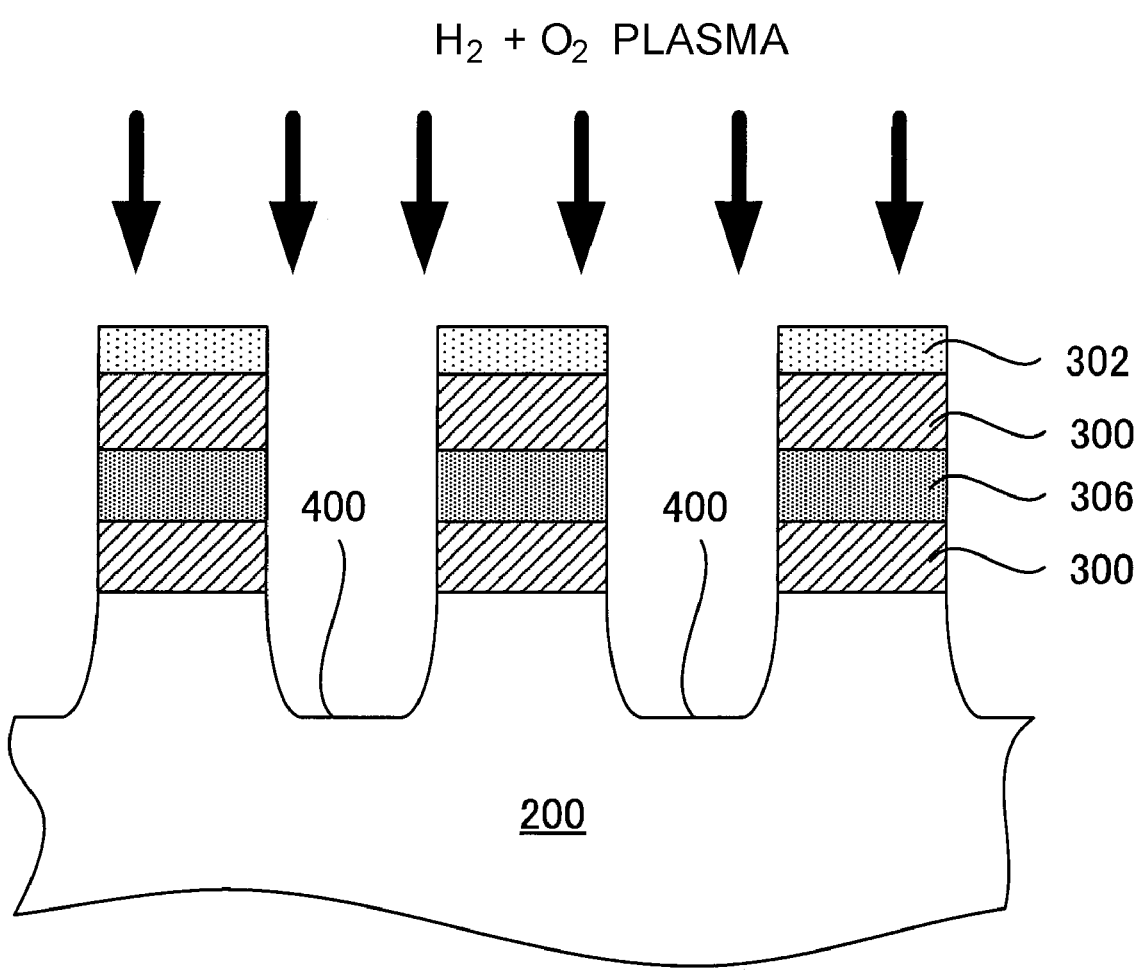

METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2016/078214, filed on Sep. 26, 2016, which claims priority under 35 U.S.C. § 119 to Application No. JP 2016-047993 filed on Mar. 11, 2016, the entire contents of which are hereby incorporated by reference.

TECHNICAL FIELD

The present disclosure relates to a method of manufacturing a semiconductor device and a non-transitory computer-readable recording medium.

BACKGROUND

Recently, semiconductor devices such as flash memories are integrated at high density. As a result, sizes of patterns of a semiconductor device are remarkably miniaturized. A predetermined process such as an oxidation process and a nitridation process on a substrate, which is one of semiconductor manufacturing processes, may be performed to form the patterns.

According to the related art, using a method of manufacturing a semiconductor device, Si—H bonds or Si—F bonds are formed by incorporating hydrogen (H) or fluorine (F) into crystal grain boundaries or crystal defects of monocrystalline silicon on an insulating material or crystal grain boundaries or crystal defects of polycrystalline silicon. For example, a hydrogen plasma process may be used to incorporate hydrogen (H) or fluorine (F) into the crystal grain boundaries or the crystal defects.

In the manufacturing process of the semiconductor device, a polysilicon film is formed on a silicon oxide film, and the hydrogen plasma process is performed on the polysilicon film to improve electrical characteristics of the polysilicon film. However, when the hydrogen plasma process is performed, the silicon oxide film serving as a base of the polysilicon film may be damaged.

SUMMARY

Described herein is a technique capable of improving electrical characteristics of a polysilicon film while suppressing damage to an underlying silicon oxide film.

According to one aspect of the technique described herein, there is provided a method of manufacturing a semiconductor device, including: (a) preparing a substrate including a silicon oxide film and a polysilicon film formed on the silicon oxide film, wherein the polysilicon film includes a contact surface contacting the silicon oxide film and an exposed surface facing the contact surface; and (b) supplying a reactive species generated by plasma excitation of a gas containing hydrogen and oxygen to the exposed surface of the polysilicon film.

BRIEF DESCRIPTION OF THE DRAWINGS

FIGS. 5A and 5B schematically illustrate an exemplary cross-sectional view of a pattern formed on a substrate to be processed according to the substrate processing of the embodiment.

FIGS. 10A and 10B illustrate evaluation results of the electrical characteristics obtained using the sample shown in FIG. 9.

FIG. 12 schematically illustrates another exemplary cross-sectional view of a pattern formed on the substrate to be processed according to the substrate processing of the embodiment.

DETAILED DESCRIPTION

Embodiment

Figure 1:
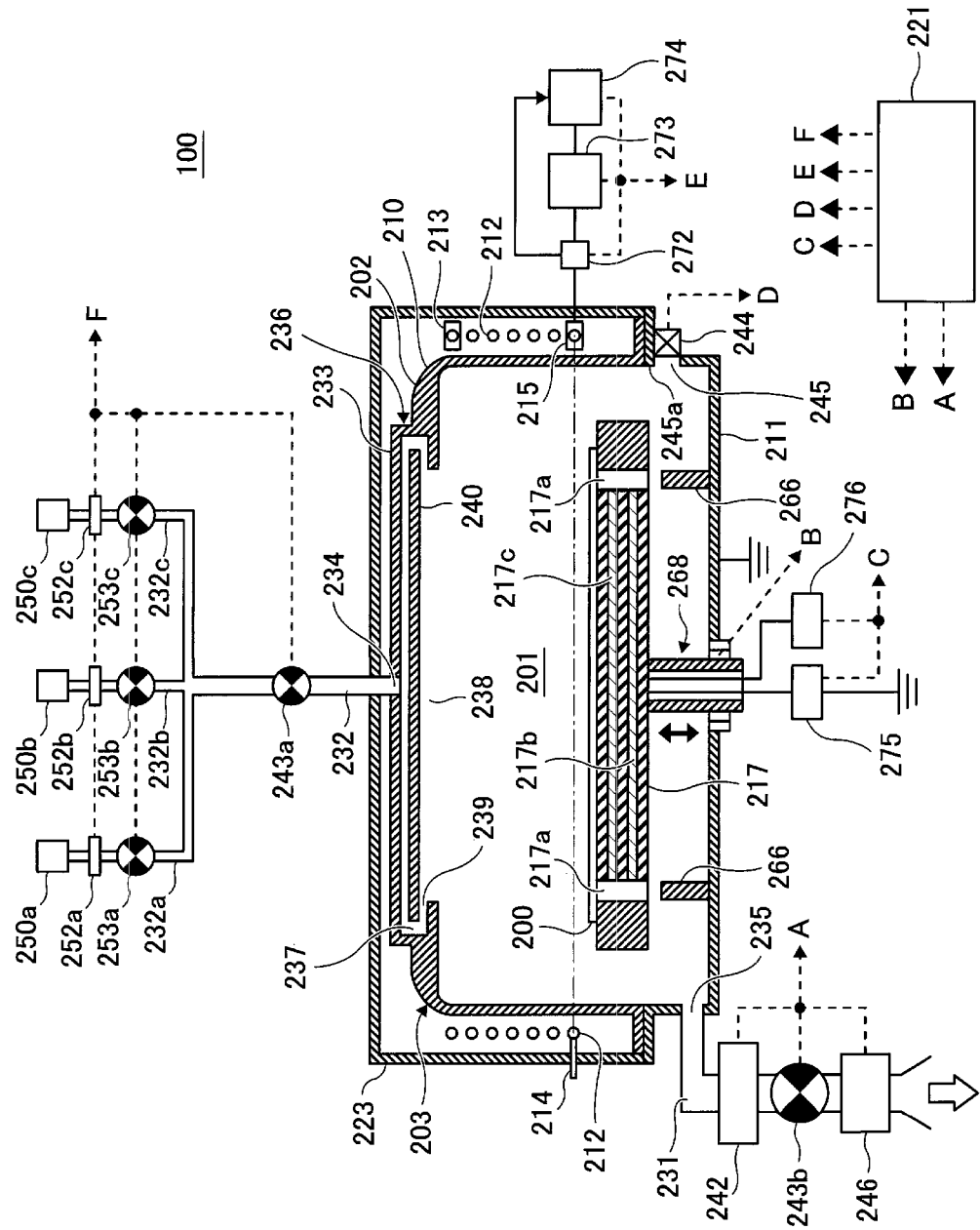
FIG. 1 schematically illustrates a substrate processing apparatus according to an embodiment described herein.

Hereafter, an embodiment will be described with reference to the drawings.

(1) Configuration of Substrate Processing Apparatus

Hereafter, a substrate processing apparatus according to the embodiment will be described with reference to FIGS. 1, 2, 3, 4, 5A and 5B.

Process Chamber

A substrate processing apparatus 100 includes a process furnace 202 where a wafer 200 is processed by plasma. The process furnace 202 includes a process vessel 203. A process chamber 201 is defined by the process vessel 203. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined. For example, the upper vessel 210 is made of a non-metallic material such as aluminum oxide ($Al_2O_3$) and quartz ($SiO_2$), and the lower vessel 211 is made of, for example, aluminum (Al).

A gate valve 244 is provided on a lower side wall of the lower vessel 211. While the gate valve 244 is open, the wafer 200 can be loaded into the process chamber 201 through a substrate loading/unloading port 245 using a transfer mechanism (not shown) or unloaded out of the process chamber 201 through the substrate loading/unloading port 245 using the transfer mechanism (not shown). While the gate valve 244 is closed, the gate valve 244 maintains the process chamber 201 airtight.

As described later, the process chamber 201 includes a plasma generation space 201*a* that a coil (resonance coil) 212 described later is provided therearound and a substrate processing space 201*b* where the wafer 200 is processed. The substrate processing space 201*b* communicates with the plasma generation space 201*a*. The plasma generation space 201*a* refers to a space where the plasma is generated, for example, a space above a lower end of the resonance coil 212 (indicated by a dashed line in FIG. 1) in the process chamber 201. The substrate processing space 201*b* refers to a space where the wafer 200 is processed by plasma, for example, a space below the lower end of the coil 212.

Susceptor

A susceptor 217 serving as a substrate support is provided at a center of a bottom portion of the process chamber 201. The wafer 200 can be placed on the susceptor 217. The susceptor 217 is made of a non-metallic material such as aluminum nitride (AlN), ceramics and quartz.

A heater 217*b* serving as a heating mechanism is integrally embedded in the susceptor 217. When electric power is supplied through a heater power adjustment mechanism 276, the heater 217*b* is configured to heat the wafer 200 such that a surface temperature of the wafer 200 may range, for example, from 25° C. to 700° C.

The susceptor 217 is electrically insulated from the lower vessel 211. An impedance adjustment electrode 217*c* is provided in the susceptor 217. The impedance adjustment electrode 217*c* is grounded via an impedance variable mechanism 275 serving as an impedance adjustment mechanism. The impedance variable mechanism 275 is constituted by components such as a coil (not shown) and a variable capacitor (not shown). The impedance variable mechanism 275 is configured to change the impedance thereof from about 0Ω to the parasitic impedance value of the process chamber 201 by controlling the inductance and resistance of the coil (not shown) and the capacitance value of the variable capacitor (not shown). Therefore, the potential (bias voltage) of the wafer 200 can be controlled via the impedance adjustment electrode 217*c* and the susceptor 217.

A susceptor elevating mechanism 268 configured to elevate and lower the susceptor 217 is provided at the susceptor 217. Wafer lift pins 266 are provided at the bottom of the lower vessel 211. Holes 217*a* wherethrough the wafer lift pins 266 penetrate are provided in the susceptor 217 corresponding to the wafer lift pins 266. At least three of the holes 217*a* and at least three of the wafer lift pins 266 are provided at positions facing each other. When the susceptor 217 is lowered by the susceptor elevating mechanism 268, the wafer lift pins 266 pass through the holes 217*a* without contacting the susceptor 217.

A substrate support part according to the embodiment is mainly constituted by the susceptor 217, the heater 217*b*, and the impedance adjustment electrode 217*c*. The susceptor 217 is elevated by the susceptor elevating mechanism 268 such that the wafer 200 is positioned below the lower end of the resonance coil 212 described later while the wafer 200 is processed.

Gas Supply System

A gas supply head 236 is provided above the process chamber 201, that is, on the upper portion of the upper vessel 210. The gas supply head 236 includes a cap-shaped lid 233, a gas inlet port 234, a buffer chamber 237, an opening portion 238, a shield plate 240 and a gas outlet port 239. The gas supply head 236 is configured to supply a reactive gas into the process chamber 201. The buffer chamber 237 functions as a dispersion space for dispersing the reactive gas supplied through the gas inlet port 234.

A downstream end of a gas supply pipe 232*a* for supplying hydrogen ($H_2$) gas serving as a hydrogen-containing gas, a downstream end of a gas supply pipe 232*b* for supplying oxygen ($O_2$) gas serving as an oxygen-containing gas, a downstream end of a gas supply pipe 232*c* for supplying nitrogen ($N_2$) gas serving as an inert gas or serving as an nitrogen-containing gas is connected to join the gas inlet port 234. A hydrogen gas supply source 250*a*, a mass flow controller (MFC) 252*a* serving as a flow rate controller (flow rate control mechanism) and a valve 253*a* serving as an opening/closing valve are provided in order from the upstream side to the downstream side of the gas supply pipe 232*a*. An oxygen gas supply source 250*b*, a mass flow controller (MFC) 252*b* serving as a flow rate controller (flow rate control mechanism) and a valve 253*b* serving as an opening/closing valve are provided in order from the upstream side to the downstream side of the gas supply pipe 232*b*. A nitrogen gas supply source 250*c*, a mass flow controller (MFC) 252*c* serving as a flow rate controller (flow rate control mechanism) and a valve 253*c* serving as an opening/closing valve are provided in order from the upstream side to the downstream side of the gas supply pipe 232*c*. A valve 243*a* is provided on the downstream side where the gas supply pipe 232*a*, the gas supply pipe 232*b* and the gas supply pipe 232*c* join. The valve 243*a* is connected to the upstream end of the gas inlet port 234. Process gases such as the hydrogen-containing gas, the oxygen-containing gas and the nitrogen-containing gas can be supplied into the process chamber 201 via the gas supply pipes 232*a*, 232*b* and 232*c* by opening and closing the valves 253*a*, 253*b*, 253*c* and 243*a* while adjusting the flow rates of the respective gases by the MFCs 252*a*, 252*b* and 252*c*.

A gas supply system according to the embodiment is mainly constituted by the gas supply head 236 (i.e., the lid 233, the gas inlet port 234, the buffer chamber 237, the opening portion 238, the shield plate 240 and the gas outlet port 239), the gas supply pipes 232*a*, 232*b* and 232*c*, the MFCs 252*a*, 252*b* and 253*c* and the valves 253*a*, 253*b* and 253*c* and 243*a*.

A hydrogen gas supply system according to the embodiment is constituted by the gas supply head 236 (i.e., the lid 233, the gas inlet port 234, the buffer chamber 237, the opening portion 238, the shield plate 240 and the gas outlet port 239), the gas supply pipe 232*a*, the MFC 252*a* and the valves 253*a* and 243*a*.

An oxygen gas supply system according to the embodiment is constituted by the gas supply head 236 (i.e., the lid 233, the gas inlet port 234, the buffer chamber 237, the opening portion 238, the shield plate 240 and the gas outlet port 239), the gas supply pipe 232*b*, the MFC 252*b* and the valves 253*b* and 243*a*.

A nitrogen gas supply system according to the embodiment is constituted by the gas supply head 236 (i.e., the lid 233, the gas inlet port 234, the buffer chamber 237, the opening portion 238, the shield plate 240 and the gas outlet port 239), the gas supply pipe 232*c*, the MFC 252*c* and the valves 253*c* and 243*a*.

Exhaust System

A gas exhaust port 235 is provided on the side wall of the lower vessel 211. The gas such as the reactive gas is exhausted from the process chamber 201 through the gas exhaust port 235. The upstream end of a gas exhaust pipe 231 is connected to the gas exhaust port 235. An APC (Automatic Pressure Controller) valve 242 serving as a pressure controller (pressure adjusting mechanism), a valve 243b serving as an opening/closing valve and a vacuum pump 246 serving as a vacuum exhaust device are provided in order from the upstream side to the downstream side of the gas exhaust pipe 231.

An exhaust system according to the embodiment is mainly constituted by the gas exhaust port 235, the gas exhaust pipe 231, the APC valve 242 and the valve 243b. The exhaust system may further include the vacuum pump 246.

Plasma Generator

A helical resonance coil 212 serving as a first electrode is provided so as to surround the process chamber 201 around the outer peripheral portion of the process chamber 201, that is, around the outer portion of the side wall of the upper vessel 210. An RF sensor 272, a high frequency power supply 273 and a frequency matching mechanism 274 are connected to the resonance coil 212.

The high frequency power supply 273 supplies a high frequency power to the resonance coil 212. The RF sensor 272 is provided at an output side of the high frequency power supply 273. The RF sensor 272 monitors information of the traveling wave or reflected wave of the supplied high frequency power. The frequency matching mechanism 274 serving as a frequency controller performs a frequency matching operation by controlling the high frequency power supply 273 so as to minimize the reflected wave based on information of the reflected wave monitored by the RF sensor 272.

Both ends of the resonance coil 212 are electrically grounded. However, at least one end of the resonance coil 212 may be grounded via a movable tap 213 to fine-tune an electrical length of the resonance coil 212 when the substrate processing apparatus 100 is initially installed or the processing conditions of the substrate processing apparatus 100 are changed. A reference numeral 214 in FIG. 1 indicates a fixed ground of the other end of the resonance coil 212. Furthermore, in order to fine-tune the impedance of the resonance coil 212 when the substrate processing apparatus 100 is initially installed or the processing conditions of the substrate processing apparatus 100 are changed, a power feeding part (not shown) is constituted by the movable tap 215 between the grounded ends of the resonance coil 212.

A shield plate 223 is provided to shield the leakage of the electromagnetic wave to the outside of the resonance coil 212 and to form a capacitive component of the resonance coil 212 necessary for constructing a resonance circuit.

The plasma generator according to the embodiment is mainly constituted by the resonance coil 212, the RF sensor 272 and the frequency matching mechanism 274. The plasma generator may further include the high frequency power supply 273.

Figure 2:
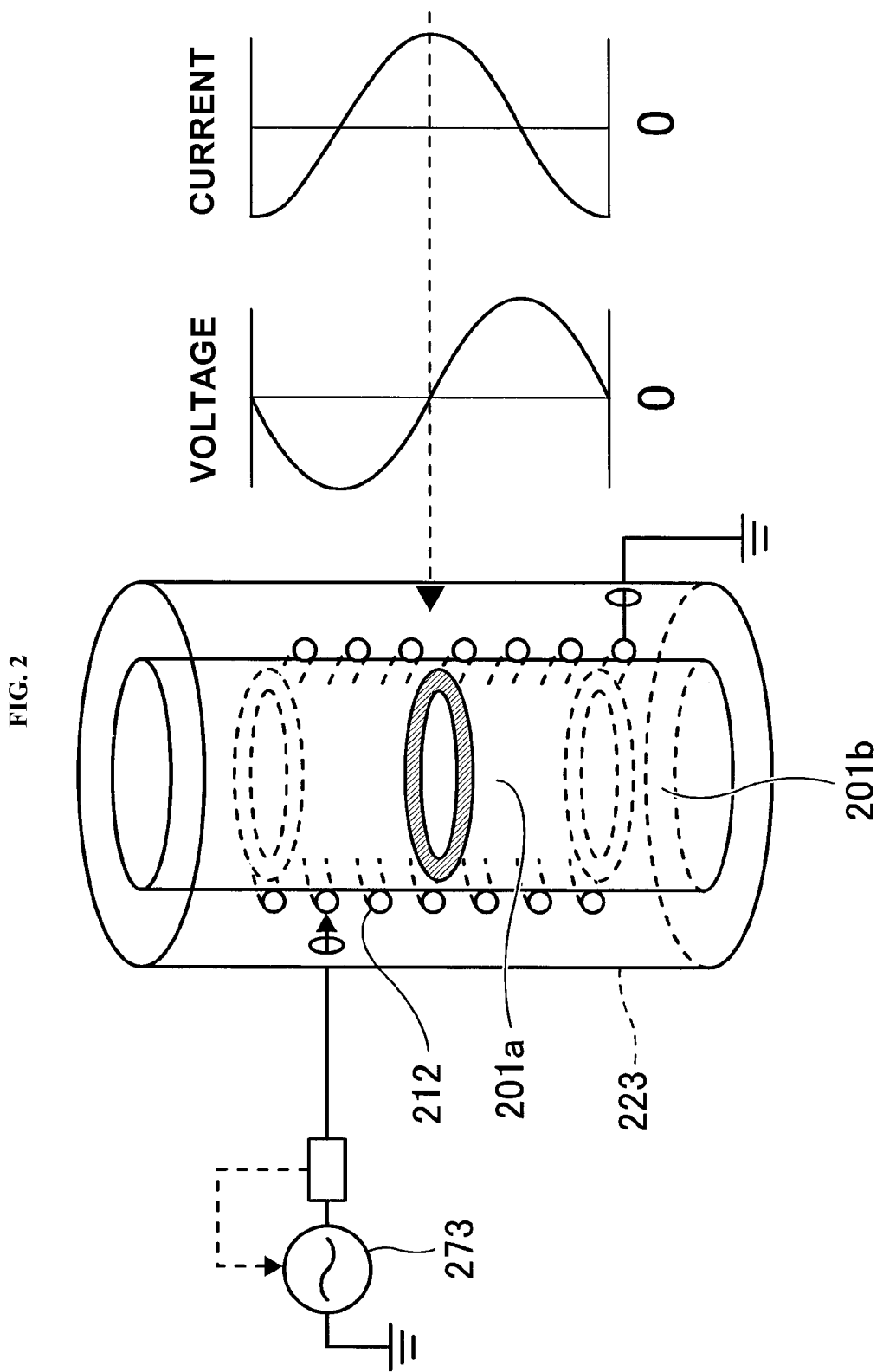
FIG. 2 schematically illustrates configurations for generating plasma of the substrate processing apparatus according to the embodiment.

Hereinafter, the principle of plasma generation in the substrate processing apparatus 100 according to the embodiment and the properties of the generated plasma will be described with reference to FIG. 2.

A winding diameter, a winding pitch and the number of winding turns of the resonance coil 212 are set such that the resonance coil 212 resonates in a full-wavelength mode to form a standing wave of a predetermined wavelength. That is, the electrical length of the resonance coil 212 is set to an integral multiple of a wavelength of a predetermined frequency of the high frequency power supplied from the high frequency power supply 273. For example, the electrical length of the resonance coil 212 is one or two times the wavelength. For example, when the predetermined frequency is 13.56 MHz, the wavelength is about 22 meters. When the predetermined frequency is 27.12 MHz, the wavelength is about 11 meters. When the predetermined frequency is 54.24 MHz, the wavelength is about 5.5 meters.

Specifically, considering the conditions such as the power to be applied, a strength of a magnetic field to be generated and shapes of the substrate processing apparatus to be applied, the resonance coil 212 having an effective cross-section of 50 mm2 to 300 mm2 and a diameter of 200 mm to 500 mm is wound, for example, twice to 60 times around the outer circumferential side of the process chamber 201 defining the plasma generation space 201a such that the magnetic field of about 0.01 Gauss to about 10 Gauss can be generated by the high frequency power having a frequency of 800 kHz to 50 MHz and a power of 0.5 KW to 5 KW, more preferably 1.0 KW to 4.0 KW.

One end or both ends (end portions) of the resonance coil 212 is normally grounded via the movable tap 213 in order to fine-tune the electrical length of the resonance coil 212 when the substrate processing apparatus 100 is initially installed and to adjust resonance characteristics of the resonance coil 212 substantially equal to those of the high frequency power supply 273. A waveform adjustment circuit (not shown) including a coil (not shown) and a shield (not shown) is inserted at one end (or the other end or both ends) of the resonance coil 212 so that the phase current and the opposite phase current can flow symmetrically with respect to an electric midpoint of the resonance coil 212. The waveform adjustment circuit is configured as an open circuit by electrically disconnecting the end portions of the resonance coil 212 or setting the end portions to an electrically equivalent state. The end portions of the resonance coil 212 may be ungrounded by a choke series resistance and connected to a fixed reference potential by a direct current connection.

The high frequency power supply 273 includes a power supply controller (control circuit) (not shown) and an amplifier (output circuit) (not shown) for amplifying to a predetermined output. The power supply controller includes a high frequency oscillation circuit (not shown) and a preamplifier (not shown) in order to adjust an oscillation frequency and the output. The power supply controller controls the amplifier based on output conditions relating to the frequency and the power, which are set in advance through an operation panel (not shown), and the amplifier supplies a constant high frequency power to the resonance coil 212 via a transmission line.

In the embodiment, the frequency matching mechanism 274 detects the power of the reflected wave from the resonance coil 212 when the plasma is generated, and increases or decreases the oscillation frequency with respect to the predetermined frequency so that the power of the reflected wave is minimized. Specifically, the frequency matching mechanism 274 includes a frequency control circuit (not shown) for correcting a preset oscillation frequency. The RF sensor 272 (also referred to as a "reflected wave power meter") is provided on the output side of the amplifier of the high frequency power supply 273 in order to detect the power of the reflected wave via the transmission line and to feed back the voltage signal thereof to the frequency control circuit.

The frequency control circuit oscillates at an unloaded resonance frequency of the resonance coil 212 before the plasma is turned on, and oscillates the frequency increased or decreased from the preset frequency after the plasma is turned on so that the power of the reflected wave becomes the minimum. As a result, the frequency control circuit supplies the frequency signal to the high frequency power supply 273 such that the reflected wave in the transmission line becomes zero.

That is, the frequency matching mechanism 274 attached to the high frequency power supply 273 compensates for the deviation of a resonance point in the resonance coil 212 due to the capacitive coupling and inductive coupling fluctuations of the generated plasma at the side of the high frequency power supply 273.

According to the invention, the resonance coil 212 more accurately form the standing wave since the high frequency power resonating accurately is output by compensating for the deviation of the resonance point in the resonance coil 212 when the plasma is generated and when conditions for generating the plasma are changed. That is, as shown in FIG. 2, the standing wave in which the phase voltage thereof and the opposite phase voltage thereof are always canceled by each other is generated in the resonance coil 212 by the transmission of an actual resonance frequency of the resonance coil 212 reflecting the influence of the plasma, and the highest phase current is generated at the electric midpoint of the resonance coil 212 (node with zero voltage). Therefore, the induction plasma excited at the electric midpoint is almost not capacitively coupled with the walls of the process chamber 201 or the susceptor 217. As a result, the donut-shaped plasma with extremely low electric potential is generated in the plasma generation space 201a.

In the embodiment, after the interior of the plasma generation space 201a is depressurized to a vacuum degree, for example, ranging from 10 Pa to 200 Pa (150 Pa in the embodiment), a gas for plasma (a mixed gas of $H_2$ gas and $O_2$ gas in the embodiment) is supplied to the plasma generation space 201a while maintaining the vacuum degree described above. When a high frequency power of, for example, 27.12 MHz and 2.5 KW, is applied from the high frequency power supply 273 to the resonance coil 212, an induced electric field is generated in the plasma generation space 201a. As a result, the supplied gas is excited by plasma in the plasma generation space 201a to a plasma state.

Controller

Figure 3:
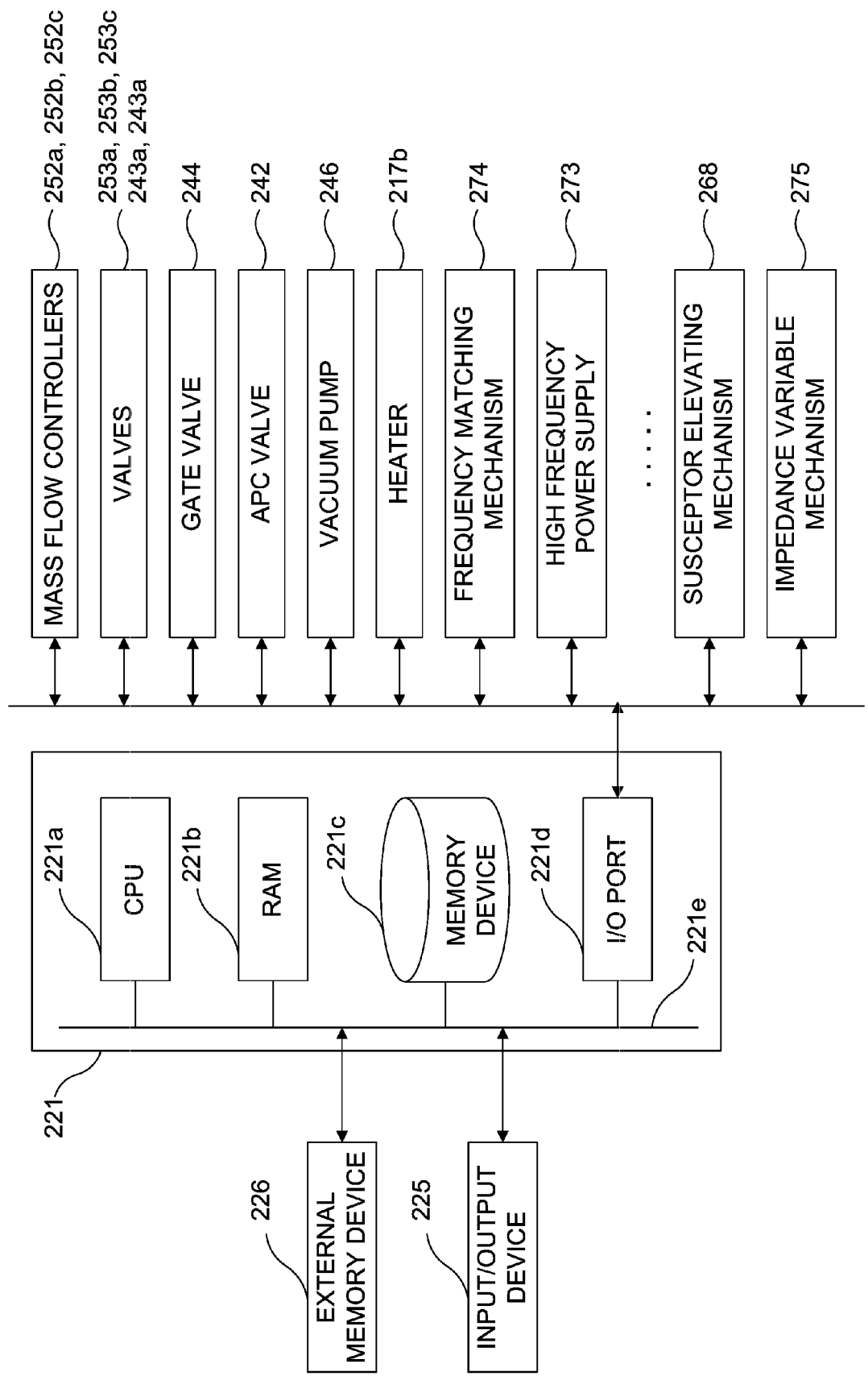
FIG. 3 is a block diagram schematically illustrating a configuration of a controller and components controlled by the controller of the substrate processing apparatus according to the embodiment.

As shown in FIG. 3, the controller 221 serving as a control mechanism is embodied by a computer including a CPU (Central Processing Unit) 221a, a RAM (Random Access Memory) 221b, a memory device 221c and an I/O port 221d. The RAM 221b, the memory device 221c and the I/O port 221d may exchange data with the CPU 221a through an internal bus 221e. For example, an input/output device 225 such as a touch panel, a mouse, a keyboard and an operation terminal (not shown) is connected to the controller 221. A display part such as a display may be connected to the controller 221.

The memory device 221c may be embodied by components such as a flash memory and a HDD (Hard Disk Drive). A control program for controlling the operation of the substrate processing apparatus 100 and a process recipe in which information such as the order and the condition of a substrate processing described later is stored are readably stored in the memory device 221c. The process recipe is a program that is executed by the controller 221 to obtain a predetermined result by performing sequences of processes of the substrate processing. The RAM 221b is a work area in which the program or the data read by the CPU 221a are temporarily stored.

The I/O port 221d is electrically connected to the above-described components such as the MFCs 252a, 252b and 252c, the valves 253a, 253b, 253c, 243a and 243b, the gate valve 244, the APC valve 242, the vacuum pump 246, the heater 217b, the RF sensor 272, the high frequency power supply 273, the frequency matching mechanism 274, the susceptor elevating mechanism 268 and the impedance variable mechanism 275.

The CPU 221a is configured to read and execute the control program stored in the memory device 221c, and read the process recipe stored in the memory device 221c in accordance with an instruction such as an operation command inputted via the input/output device 225. The CPU 221a is configured to control operation of the substrate processing apparatus 100 according to the process recipe. For example, as shown in FIG. 1, the CPU 221a may be configured to perform operation, according to the process recipe, such as an operation of adjusting the opening degree of the APC valve 242, an opening/closing operations of the valve 243b and a start and stop of the vacuum pump 246 via the I/O port 221d and a signal line A, an elevating/lowering operation of the susceptor elevating mechanism 268 via the I/O port 221d and a signal line B, a power supply amount adjusting operation (temperature adjusting operation) to the heater 217b by the heater power adjustment mechanism 276 based on the temperature detected by a temperature sensor (not shown) and an impedance adjusting operation by the impedance variable mechanism 275 via the I/O port 221d and a signal line C, an opening/closing operation of the gate valve 244 via the I/O port 221d and a signal line D, a controlling operation of the RF sensor 272, the high frequency power supply 273 and the frequency matching mechanism 274 via the I/O port 221d and a signal line E, and gas flow rate adjusting operations of the MFCs 252a, 252b and 252c and opening/closing operations of the valves 253a, 253b, 253c and 243a via the I/O port 221d and a signal line F.

(2) Substrate Processing

Figure 4:
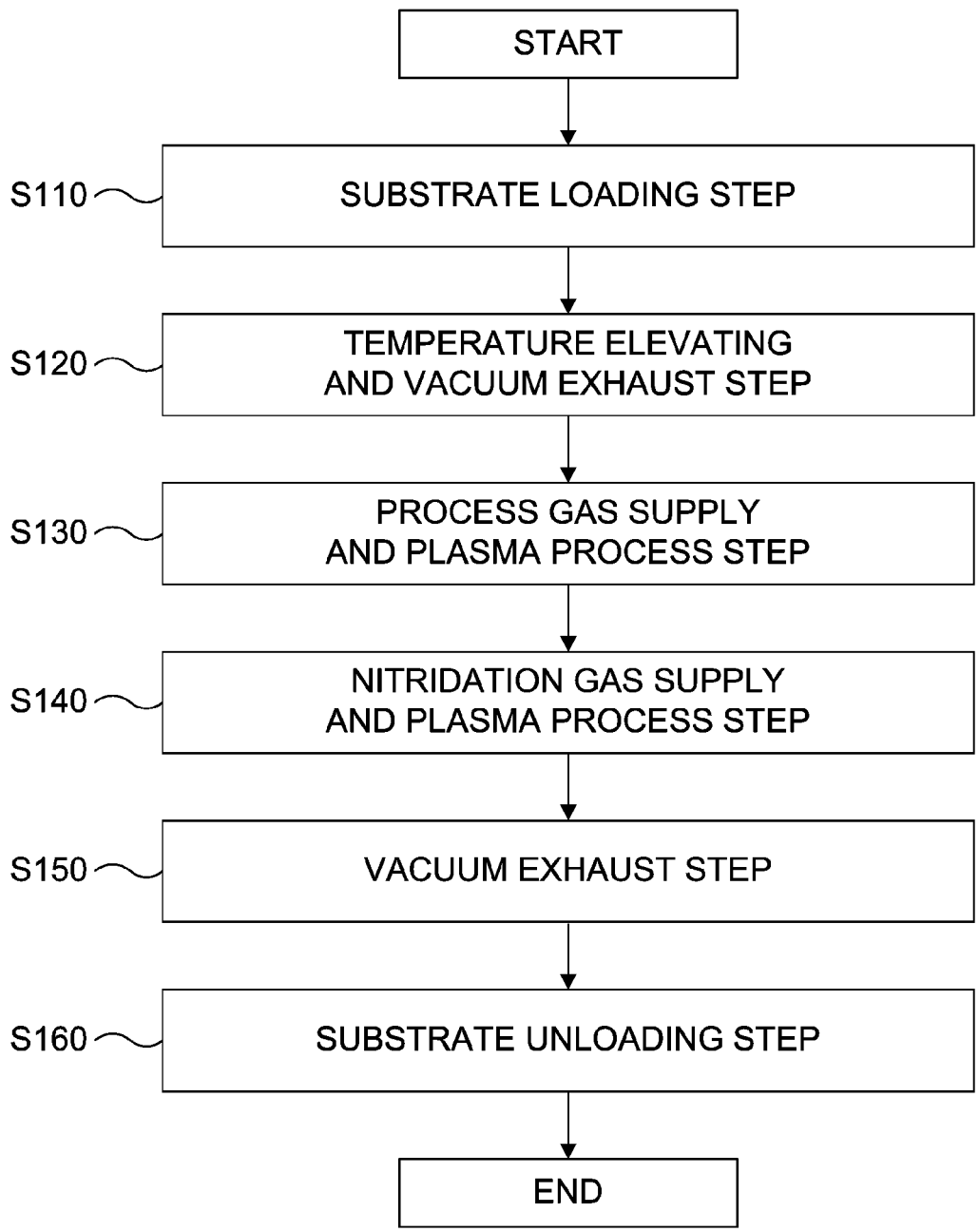
FIG. 4 is a flowchart illustrating a substrate processing according to the embodiment.
Figure 5B:
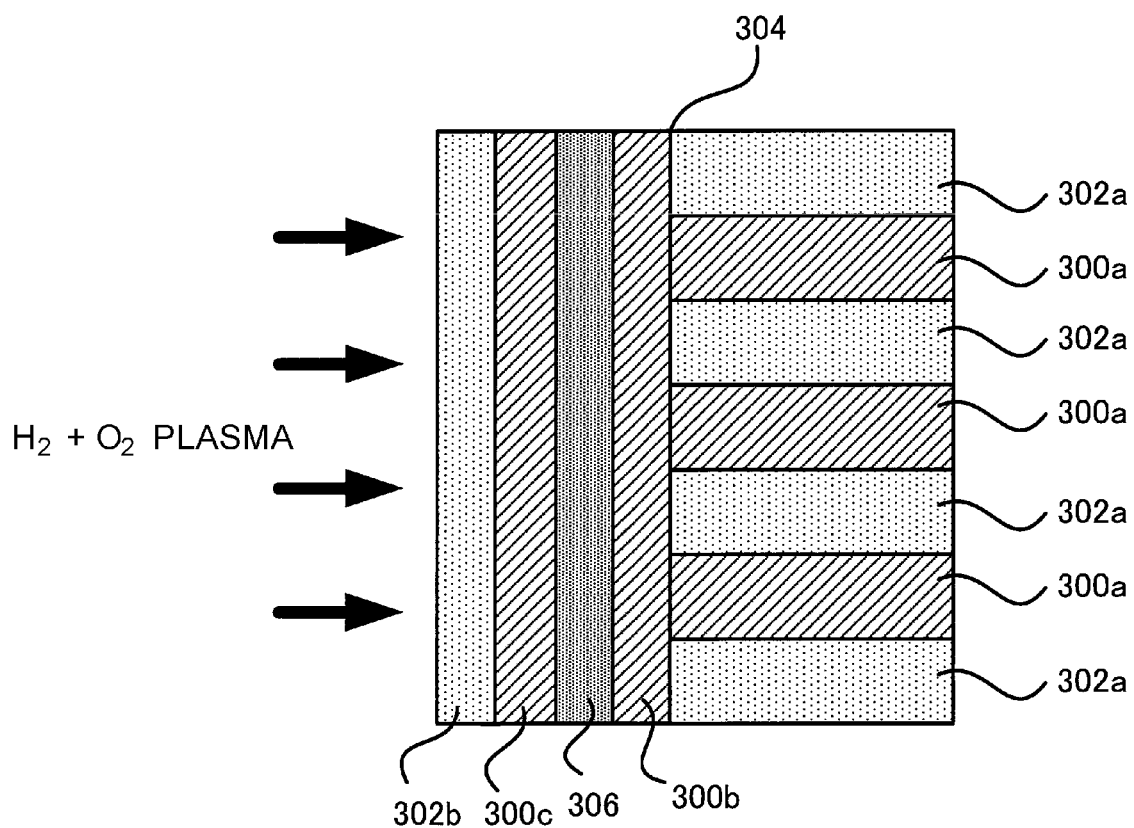

Hereinafter, the substrate processing according to the embodiment will be described with reference to FIGS. 4, 5A and 5B. FIGS. 5A and 5B schematically illustrate an exemplary cross-sectional view of a pattern formed on a substrate to be processed according to the substrate processing of the embodiment. FIG. 5A schematically illustrates the pattern and FIG. 5B schematically illustrate an enlarged view of a part of the pattern shown in FIG. 5A. The substrate processing according to the embodiment is performed by the above-described substrate processing apparatus 100, as one of the manufacturing processes of the semiconductor device such as a flash memory. In the following description, the components of the substrate processing apparatus 100 are controlled by the controller 221.

For example, as shown in FIG. 5A, a pattern having a three-dimensional structure is formed on the wafer 200 to be processed according to the substrate processing of the embodiment. Specifically, the structure of the pattern is, for example, a cylindrical 3D-NAND structure. The structure is formed by the following procedures. First, a silicon oxide film 300a and a polysilicon film 302a are continuously (sequentially) stacked on the wafer 200 serving as the substrate. A stacked film of the silicon oxide film 300a and the polysilicon film 302a is etched to form a hole 304. Then, a silicon oxide film 300b, a silicon nitride film 306, a silicon oxide film 300c and a polysilicon film 302b are sequentially formed and stacked in order from an inner peripheral surface of cylindrical structure defined by the hole 304 toward a center of the cylindrical structure (i.e., from an outer portion of the cylindrical structure to the center of the cylindrical structure). The polysilicon film 302b is used as a channel part described later. In the embodiment, the polysilicon film 302b may be a mixed crystal silicon film with amorphous silicon. In addition, the silicon oxide film 300b of the embodiment may be a film containing nitrogen (N) or carbon (C). That is, the silicon oxide film 300b may be a film such as a silicon oxynitride (SiON) film and a silicon oxycarbide (SiOC) film.

In the embodiment, a plasma process (modifying process) is performed on the polysilicon film 302b exposed in the cylindrical structure by using plasma of a gas containing hydrogen (H) atoms to improve the electrical characteristics of the polysilicon film 302b. However, as will be described later, when the polysilicon film 302b is modified by the modifying process using the plasma of the gas containing hydrogen (H) atoms, the silicon oxide film 300c which is a base film (also referred to as a "underlying film") adjacent to the polysilicon film 302b is damaged. Thus, it becomes difficult for the silicon oxide film 300c to serve as a base insulating film.

In order to avoid above-described problem, for example, it is possible to form a silicon oxide film on a polysilicon film after the polysilicon film is processed by the plasma. That is, the polysilicon film is formed, the polysilicon film is processed by the plasma and the silicon oxide film is formed on the polysilicon film after the polysilicon film is processed by the plasma. However, there are some cases where it is necessary to form, for example, a cylindrical 3D-NAND structure having a silicon oxide film serving as the base film and a polysilicon film formed on the silicon oxide film. According to the embodiment, the plasma process can be performed to the structure having the silicon oxide film and the polysilicon film formed on the silicon oxide film while suppressing the damage of the silicon oxide film.

In the embodiment, for example, a thickness of at least a part of the polysilicon film 302b is equal to or less than 7 nm. When the thickness of the polysilicon film 302b is equal to or less than 7 nm, the damage of the silicon oxide film 300c in a portion where the silicon oxide film 300c is in contact with the polysilicon film 302b (hereinafter, also referred to as a "contact surface") becomes remarkable. Thus, the embodiment is more preferably applied when the thickness of the polysilicon film 302b is equal to or less than 7 nm. The embodiment will be described in detail below.

Substrate Loading Step S110

First, in a substrate loading step S110, the wafer 200 having the cylindrical structure formed thereon is loaded into the process chamber 201. Specifically, the susceptor 217 is lowered to a position for transferring the wafer 200 ("wafer transfer position") by the susceptor elevating mechanism 268. The wafer lift pins 266 penetrate the holes 217a of the susceptor 217. As a result, the wafer lift pins 266 protrude from the surface of the susceptor 217 by a predetermined height.

Next, the gate valve 244 is opened and the wafer 200 is loaded into the process chamber 201 from a vacuum transfer chamber (not shown) adjacent to the process chamber 201 by the transfer mechanism (not shown). As a result, the wafer 200 is horizontally supported by the wafer lift pins 266 protruding from the surface of the susceptor 217. After the wafer 200 is transferred into the process chamber 201, the transfer mechanism is retracted to the outside of the process chamber 201, and the gate valve 244 is closed to seal the process chamber 201. Thereafter, the susceptor elevating mechanism 268 elevates the susceptor 217 until the wafer 200 is at a predetermined position between the lower end 203a of the resonance coil 212 and an upper end 245a of the substrate loading/unloading port 245. As a result, the wafer 200 is placed on the upper surface of the susceptor 217 and supported by the susceptor 217. The substrate loading step S110 may be performed while purging the interior of the process chamber 201 with a gas such as $N_2$ gas serving as an inert gas.

Temperature Elevating and Vacuum Exhaust Step S120

Next, in a temperature elevating and vacuum exhaust step S120, the temperature of the wafers 200 loaded into the process chamber 201 is elevated. The heater 217b embedded in the susceptor 217 is pre-heated. By placing the wafer 200 on the susceptor 217 where the heater 217b is embedded, the wafer 200 is heated to a predetermined temperature. For example, the predetermined temperature of the wafer 200 ranges from 100° C. to 500° C. In the embodiment, for example, the predetermined temperature of the wafer 200 is 300° C. While the wafer 200 is being heated, the vacuum pump 246 vacuum-exhausts the inside of the process chamber 201 through the gas exhaust pipe 231 such that the inner pressure of the process chamber 201 is at a predetermined pressure. For example, the predetermined pressure ranges from 30 Pa to 400 Pa. In the embodiment, for example, the predetermined pressure is 200 P. The vacuum pump 246 vacuum-exhausts the inside of the process chamber 201 at least until a substrate unloading step S160 described later is completed.

Process Gas Supply and Plasma Process Step S130

Next, in a process gas supply and plasma process step S130, a gas containing hydrogen (H) atoms and oxygen (O) atoms serving as one of the process gases is supplied into the process chamber 201 and a plasma process is performed on the polysilicon film 302b by plasma-exciting the gas containing hydrogen atoms and oxygen atoms. In the embodiment, a mixed gas of $H_2$ gas serving as the hydrogen-containing gas and $O_2$ gas serving as the oxygen-containing gas is supplied. Specifically, the step S130 is performed as follows.

Flow Rate Adjusting Step

In a flow rate adjusting step, the valves 243a, 253a and 253b are opened to supply the mixed gas of $H_2$ gas and $O_2$ gas into the process chamber 201 via the buffer chamber 237. Specifically, the valve 253a is opened to supply of the $H_2$ gas into the process chamber 201 via the buffer chamber 237 while the flow rate of the $H_2$ gas is adjusted by the MFC 252a. Simultaneously, the valve 253b is opened to supply of the $O_2$ gas into the process chamber 201 via the buffer chamber 237 while the flow rate of the $O_2$ gas is adjusted by the MFC 252b. In the flow rate adjusting step, for example, the amount of the $H_2$ gas supplied into the process chamber 201 ranges from 50 sccm to 2000 sccm. For example, the amount of the $O_2$ gas supplied into the process chamber 201 ranges from 50 sccm to 2000 sccm. The opening degree of each of the MFCs 252a and 252b is adjusted such that a volume ratio of the $H_2$ gas to the $O_2$ gas in the mixed gas ranges from 5:95 to 95:5. For example, the amount of the $H_2$ gas supplied into the process chamber 201 is 400 sccm, and the amount of the $O_2$ gas supplied into the process chamber 201 is 600 sccm. When the volume ratio of the $H_2$ gas to the $O_2$ gas in the mixed gas is less than 5:95, the effect of improving the electrical characteristics of the polysilicon film as described below may not be sufficiently obtained. Further, when the volume ratio of the $H_2$ gas to the $O_2$ gas in the mixed gas is greater than 95:5, the effects such as reduction of the damage to the underlying silicon oxide film may not be achieved as described later.

The inside of the process chamber 201 is exhausted by adjusting the opening degree of the APC valve 242 such that the inner pressure of the process chamber 201 is at a predetermined pressure. For example, the predetermined pressure ranges from 10 Pa to 400 Pa, preferably from 50 Pa to 300 Pa. In the embodiment, for example, the predetermined pressure is 150 Pa. The mixed gas of the $H_2$ gas and the $O_2$ gas is continuously supplied while the inside of the process chamber 201 is properly exhausted until a plasma excitation step of the process gas supply and plasma process step S130 described later is completed.

The $H_2$ gas may be introduced (supplied) into the process chamber 201 before supplying the mixed gas so that the inner pressure of the process chamber 201 is adjusted to the predetermined pressure. By supplying the $H_2$ gas before supplying the mixed gas, it is possible to suppress an abrupt oxidation of a control electrode 602 while maintaining the inner pressure of the process chamber 201 at the start of supplying the mixed gas.

Plasma Excitation Step

After a predetermined time elapses from the start of the supply of the mixed gas of the $H_2$ gas and the $O_2$ gas, for example, after several seconds elapse, the high frequency power is applied to the resonance coil 212 from the high frequency power supply 273 via the RF sensor 272. For example, the high frequency power of 27.12 MHz ranges from 0.5 KW to 3.5 KW. In the embodiment, for example, the high frequency power is 2.5 KW. As a result, an induction magnetic field is generated in the plasma generation space 201a, and a donut-shaped induction plasma is excited at a height corresponding to the electric midpoint of the resonance coil 212 in the plasma generation space 201a. The $H_2$ gas and the $O_2$ gas are activated by the excited plasma and dissociate. As a result, reactive species such as an active species containing hydrogen (H) atoms and oxygen (O) atoms, an active species containing hydrogen atoms, a hydrogen ion, an active species containing oxygen atoms and an oxygen ion (including OH and H, for example) are generated. Hydrogen atoms and oxygen atoms are contained in the at least one reactive species generated by the excited plasma.

As described above, the standing wave in which the phase voltage thereof and the opposite phase voltage thereof are always canceled is generated in the resonance coil 212 and the highest phase current is generated at the electric midpoint of the resonance coil 212 (node with zero voltage). Therefore, the induction plasma excited at the electric midpoint is almost not capacitively coupled with the walls of the process chamber 201 or the susceptor 217. As a result, the donut-shaped plasma with extremely low electric potential is generated in the plasma generation space 201a.

Furthermore, as described above, the power supply controller attached to the high frequency power supply 273 compensates for the deviation of the resonance point in the resonance coil 212 due to the variation of the capacitive coupling or inductive coupling of the plasma to form the standing wave more accurately. Thus, the plasma with extremely low electric potential and almost no capacitive coupling can be generated more reliably in the plasma generation space 201a.

A gas containing the at least one reactive species generated by activating the mixed gas of the $H_2$ gas and the $O_2$ gas by plasma is supplied to the surface (exposed surface) of the polysilicon film 302b to modify the polysilicon film 302b. That is, hydrogen atoms contained in the at least one reactive species react with the polysilicon film 302b, and hydrogen atoms are added to the polysilicon film 302b. As will be described later, the supplied reactive species may also react with the silicon oxide film 300c which is the base film of the polysilicon film 302b. However, in the embodiment, since the supplied reactive species contains oxygen atoms, it is possible to suppress the damage to the silicon oxide film 300c in the modifying process.

While the mixed gas of the $H_2$ gas serving as the hydrogen-containing gas and the $O_2$ gas serving as the oxygen-containing gas is used as the gas containing hydrogen atoms and oxygen atoms in the embodiment, the embodiment is not limited thereto. For example, a mixed gas of the hydrogen-containing gas other than the $H_2$ gas and the oxygen-containing gas other than the $O_2$ gas may be used. For example, O3 (ozone) gas may be used as the oxygen-containing gas. Further, as the gas containing hydrogen atoms and oxygen atoms, a gas of a molecule containing both hydrogen atoms and oxygen atoms may be supplied and excited into the plasma. For example, $H_2O$ gas or $H_2O_2$ gas may be used as the gas of the molecule containing both hydrogen atoms and oxygen atoms. For example, a gas containing deuterium (D) may be used as the hydrogen-containing gas. In addition, a rare gas such as argon (Ar) may be added if necessary. In the embodiment, for example, a ratio of hydrogen atoms to oxygen atoms in the gas containing hydrogen atoms and oxygen atoms ranges from 5:95 to 95:5. When the ratio of hydrogen atoms and oxygen atoms in the gas containing hydrogen atoms and oxygen atoms is less than 5:95, the electrical characteristics of the polysilicon film as described below may not be enhanced sufficiently. Further, when the ratio of hydrogen atoms and oxygen atoms in the gas containing hydrogen atoms and oxygen atoms is greater than 95:5, the effects such as reduction of damage to the underlying silicon oxide film may not be achieved as described later.

While the gas containing hydrogen atoms and oxygen atoms is supplied into the process chamber 201 and then excited by the plasma to generate the reactive species such as the active species according to the embodiment, the embodiment is not limited thereto. For example, the gas containing hydrogen atoms and oxygen atoms is excited by the plasma outside the process chamber 201 to generate the reactive species such as the active species and the generated reactive species is supplied into the process chamber 201. Alternatively, the hydrogen-containing gas and the oxygen-containing gas are excited by the plasma separately, and the reactive species such as the active species separately generated as above are mixed and supplied to the polysilicon film 302b.

After a predetermined process time elapses from the start of the application of the high frequency power, for example, after 10 second to 1200 seconds elapse, the output of the power from the high frequency power supply 273 is stopped to stop the plasma discharge in the process chamber 201. In the embodiment, for example, the predetermined process time is 120 seconds. The valves 253a and 253b are closed to stop the supply of the $H_2$ gas and $O_2$ gas into the process chamber 201.

Here, hydrogen atoms supplied to the polysilicon film 302b is eliminated by a subsequent heating process of heating the wafer 200, for example, from 300° C. to 600° C. In order to prevent hydrogen atoms from being eliminated, a nitridation gas supply and plasma process step S140 described below is performed.

Nitridation Gas Supply and Plasma Process Step S140

Next, a gas containing nitrogen (N) atoms (nitrogen-containing gas) serving as a nitridation gas is supplied into the process chamber 201. In the embodiment, $N_2$ gas is used as the nitrogen-containing gas. Specifically, the nitrogen-containing gas is supplied as follows.

Flow Rate Adjusting Step

In a flow rate adjusting step, the valves 243a and 253c are opened to supply the $N_2$ gas into the process chamber 201 via the buffer chamber 237. Specifically, the valve 253c is opened to supply of the $N_2$ gas into the process chamber 201 via the buffer chamber 237 while the flow rate of the $N_2$ gas is adjusted by the MFC 252c. In the flow rate adjusting step, for example, the amount of the $N_2$ gas supplied into the process chamber 201 ranges from 50 sccm to 3000 sccm. In the embodiment, for example, the amount of the $N_2$ gas supplied into the process chamber 201 is 0.2 slm.

The inside of the process chamber 201 is exhausted by adjusting the opening degree of the APC valve 242 such that the inner pressure of the process chamber 201 is at a predetermined pressure. For example, the predetermined pressure ranges from 0.1 Pa to 50 Pa, preferably from 1 Pa to 10 Pa. In the embodiment, for example, the predetermined pressure is 5 Pa. The $N_2$ is continuously supplied while the inside of the process chamber 201 is properly exhausted until a plasma excitation step of the nitridation gas supply and plasma process step S140 described later is completed.

Plasma Excitation Step

After a predetermined time elapses from the start of the supply of the $N_2$ gas, for example, after several seconds, the high frequency power is applied to the resonance coil 212 from the high frequency power supply 273 via the RF sensor 272. In the embodiment, for example, the high frequency power is 1500 W. After a predetermined process time elapses from the start of the application of the high frequency power, for example, after 10 second to 1200 seconds elapse, the output of the power from the high frequency power supply 273 is stopped to stop the plasma discharge in the process chamber 201. In the embodiment, for example, the predetermined process time is 120 seconds. The valve 253c is closed to stop the supply of the $N_2$ gas into the process chamber 201.

Thereby, the induction plasma is excited and the $N_2$ gas is activated by the excited plasma. As a result, a nitrogen active species (reactive species) containing nitrogen (N) atoms is generated. The nitrogen active species reacts with the surface of the modified polysilicon film 302b, and a nitride film (SiN film) of about 2 nm is formed on the surface of the modified polysilicon film 302b. That is, by activating the $N_2$ gas by plasma, a dense silicon nitride (SiN) film is formed on the exposed surface of the polysilicon film 302b. The SiN film serves as a barrier to suppress hydrogen atoms from being eliminated from the surface of the polysilicon film 302b.

Vacuum Exhaust Step S150

After the predetermined processing time elapses and the supply of the $N_2$ gas is stopped, in a vacuum exhaust step S150, the inside of the process chamber 201 is vacuum-exhausted by using the gas exhaust pipe 231. As a result, an exhaust gas such as the $H_2$ gas, the $O_2$ gas and other residues in the process chamber 201 is exhausted to the outside of the process chamber 201. Thereafter, the opening degree of the APC valve 242 is adjusted such that the inner pressure of the process chamber 201 is adjusted to the same pressure as that of the vacuum transfer chamber (not shown) where the wafer 200 is transferred in the substrate unloading step S160 described below.

Substrate Unloading Step S160

After the inner pressure of the process chamber 201 reaches a predetermined pressure, the susceptor 217 is lowered to the wafer transfer position described above until the wafer 200 is supported by the wafer lift pins 266. Then, the gate valve 244 is opened and the wafer 200 is unloaded from the process chamber 201 to the outside of the process chamber 201 by the transfer mechanism (not shown). In the substrate unloading step S160, the wafer 200 is unloaded while purging the interior of the process chamber 201 with an inert gas such as $N_2$ gas. Thereby, the substrate processing according to the embodiment is completed.

According to the embodiment, by performing the modifying process using the plasma of the gas containing hydrogen atoms, hydrogen components (hydrogen atoms) are added to the polysilicon film 302b. Thus, it is possible to improve the electrical characteristics such as the electron mobility. Further, by performing the modifying process using the plasma of the gas containing the oxygen atom together with hydrogen atoms, it is possible to suppress the damage such as the reduction of the oxygen components (oxygen atoms) to the silicon oxide film 300c in the contact surface where the silicon oxide film 300c contacts the polysilicon film 302b. Therefore, by performing the modifying process as above is performed with respect to the polysilicon film 302b on the surface of the wafer 200 where the silicon oxide film 300c and the polysilicon film 302b are sequentially formed in order, it is possible to suppress the damage to the silicon oxide film 300c serving as the base film and improve the degree of freedom of the semiconductor device forming process. Further, by performing the nitridation process using the plasma of the nitrogen-containing gas on the surface of the polysilicon film 302b after the polysilicon film 302b is processed by the hydrogen plasma, it is possible to suppress the hydrogen components (hydrogen atoms) added to the polysilicon film 302b by the modifying process using the hydrogen plasma from being eliminated in a subsequent process such as a heating process.

EXAMPLES

Figure 6:
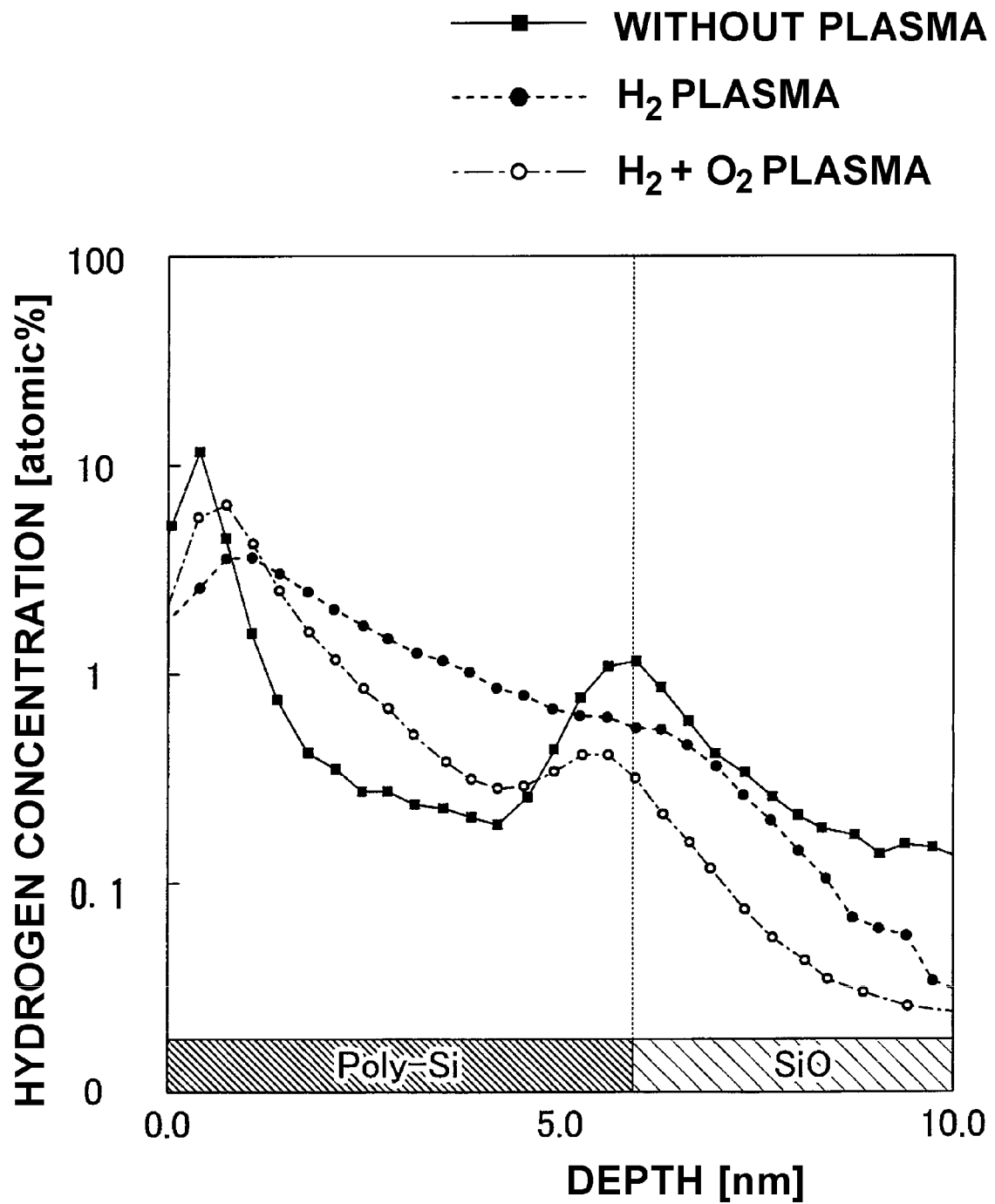
FIG. 6 illustrate hydrogen concentrations of the substrate processed according to the substrate processing of the embodiment and hydrogen concentrations of the substrate processed according to a substrate processing of comparative examples.
Figure 7:
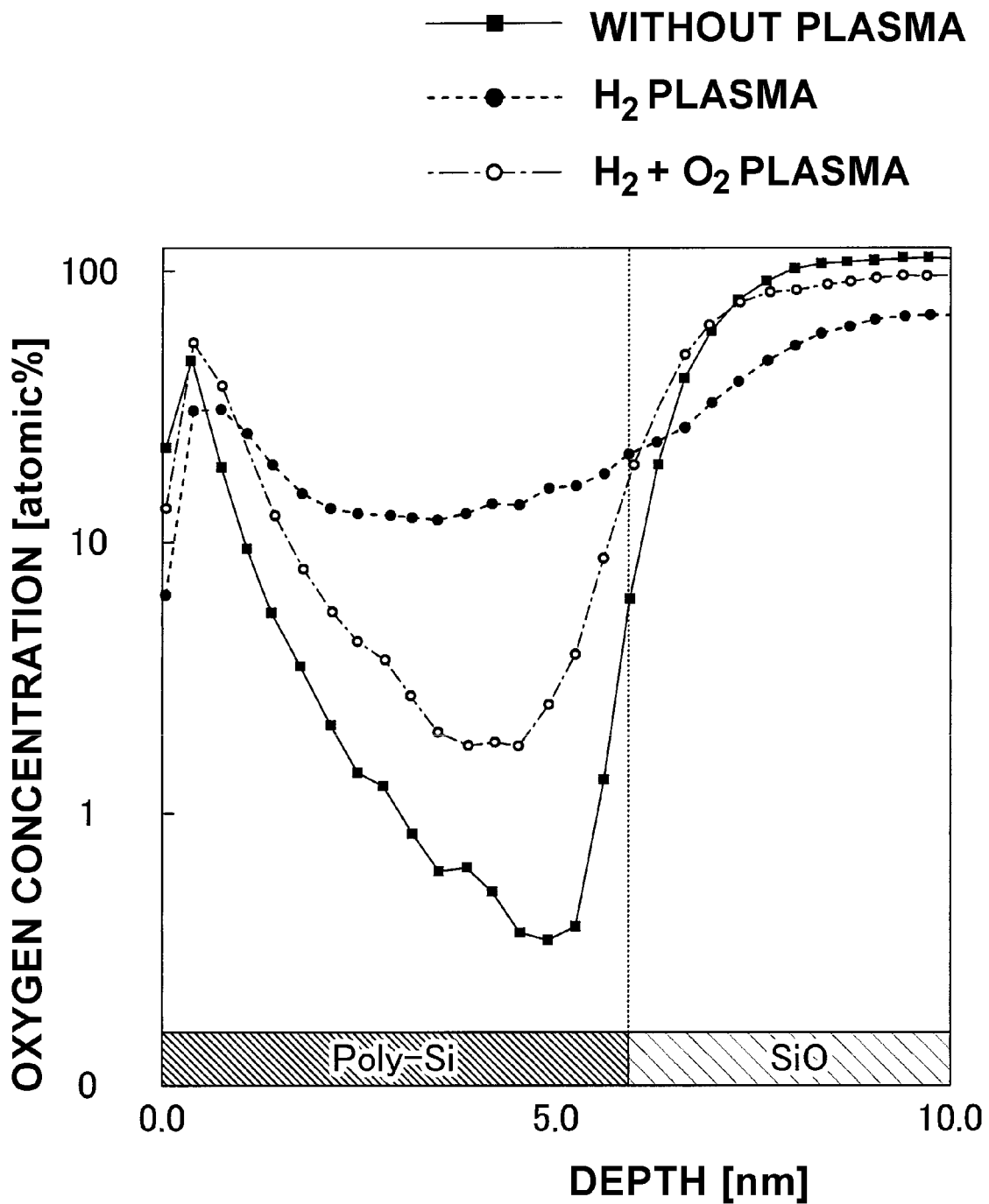
FIG. 7 illustrate oxygen concentrations of the substrate processed according to the substrate processing of the embodiment and oxygen concentrations of the substrate processed according to a substrate processing of comparative examples.

FIGS. 6 and 7 illustrate concentrations of components in the polysilicon film and the silicon oxide film of the wafer processed according to the substrate processing of the embodiment and concentrations of components in the polysilicon film and the silicon oxide film of the wafer processed according to a substrate processing of comparative examples. The concentrations of components are analyzed by SIMS (Secondary Ion Mass Spectrometry). FIG. 6 illustrates hydrogen concentrations analyzed and compared and FIG. 7 illustrates oxygen concentrations analyzed and compared. The vertical axis of FIG. 6 represents the hydrogen concentration and the vertical axis of FIG. 7 represents the oxygen concentration. The horizontal axes of FIGS. 6 and 7 represent a depth from the surface of the polysilicon film. In FIGS. 6 and 7, a region indicated by "Poly-Si" represents a region (depth) where the polysilicon film is formed and a region indicated by "SiO" represents a region (depth) where the silicon oxide film is formed.

In FIGS. 6 and 7, a graph indicated by "■" represents concentrations of a first comparative example where the polysilicon film of the wafer is not processed by plasma ("WITHOUT PLASMA" in FIGS. 6 and 7), a graph indicated by "●" represents concentrations of a second comparative example where the polysilicon film of the wafer is processed by plasma using only the $H_2$ gas according to the substrate processing of the embodiment ("$H_2$ PLASMA" in FIGS. 6 and 7) and a graph indicated by "○" represents concentrations of an example where the polysilicon film of the wafer is processed by plasma using the mixed gas of the $H_2$ gas and the $O_2$ gas according to the substrate processing of the embodiment ("$H_2+O_2$ PLASMA" in FIGS. 6 and 7). In the second comparative example, a flow rate of the $H_2$ gas is 1000 sccm. In the example, a flow rate of the $H_2$ gas is 400 sccm and a flow rate of the $O_2$ gas is 400 sccm.

As shown in FIG. 6, the hydrogen concentration in the polysilicon film when the polysilicon film is processed by plasma as in the second comparative example and the example is higher than the hydrogen concentration of the polysilicon film when the polysilicon film is not processed by plasma as in the first comparative example. That is, hydrogen atoms are added to the polysilicon film by performing the plasma processes using the gas containing hydrogen atoms or the mixed gas containing hydrogen atoms and oxygen atoms. Therefore, it is possible to reduce the defect density in the polysilicon film by the adding hydrogen atoms and to increase the size of polysilicon particles. Thus, it is possible to improve the electron mobility in the polysilicon film and the electrical characteristics of the semiconductor device.

The hydrogen concentration in the polysilicon film when the silicon oxide film is processed by plasma as in the example is lower than the hydrogen concentration of the silicon oxide film when the polysilicon film is not processed by plasma in first comparative example or the polysilicon film is processed by plasma as in the second comparative example. That is, hydrogen atoms are added to the polysilicon film by performing the plasma process using the mixed gas containing hydrogen atoms and oxygen atoms while suppressing the addition of hydrogen atoms to the silicon oxide film serving as the base film. It is presumed that hydrogen atoms contained in the reactive species are suppressed from being added to the silicon oxide film because oxygen atoms contained in the reactive species generated from the mixed gas in the example preferentially react with the silicon oxide film.

As shown in FIG. 7, the oxygen concentration in the polysilicon film when the polysilicon film is processed by plasma using only the $H_2$ gas as in the second comparative example is greatly increased compared with the oxygen concentrations in the polysilicon film of the first comparative example and the example, and the oxygen concentration in the silicon oxide film of the second comparative example is greatly decreased compared with the oxygen concentrations in the silicon oxide film of the first comparative example and the example. From this result, it is presumed that oxygen atoms contained in the silicon oxide film penetrated (diffused) into the polysilicon film due to the plasma process of the second comparative example. That is, in the plasma process using only the $H_2$ gas as in the second comparative example, oxygen atoms constituting the silicon oxide film are greatly separated from the silicon oxide film (that is, the silicon oxide film is damaged), thereby insulation characteristics of the silicon oxide film serving as the base insulating film may greatly deteriorate.

The oxygen concentration in the silicon oxide film of the example is slightly decreased, but the decrease of the oxygen concentration in the silicon oxide film of the example is suppressed as compared with the oxygen concentration in the silicon oxide film of the second comparative example. The oxygen concentration in the polysilicon film of the example is slightly increased, but the increase of the oxygen concentration in the polysilicon film of the example is suppressed as compared with the oxygen concentration in the polysilicon film of the second comparative example. From this result, it can be seen that, even when the plasma process of the example is performed, oxygen atoms in the silicon oxide film are prevented from penetrating (diffusing) into the polysilicon film. It is presumed that the desorption of oxygen atoms in the silicon oxide film is suppressed because oxygen atoms contained in the reactive species generated from the mixed gas in the example preferentially react with the silicon oxide film while suppressing hydrogen atoms contained in the reactive species generated from the mixed gas in the example reacting with oxygen atoms in the silicon oxide film.

According to the embodiment, it is possible to suppress oxygen atoms constituting the silicon oxide film from being separated from the silicon oxide film (that is, the silicon oxide film is damaged) and diffused into the polysilicon film. Therefore, even when the polysilicon film is processed by plasma using the gas containing hydrogen atoms, it is possible to maintain the insulation characteristics of the silicon oxide film serving as the base insulating film.

Figure 8:
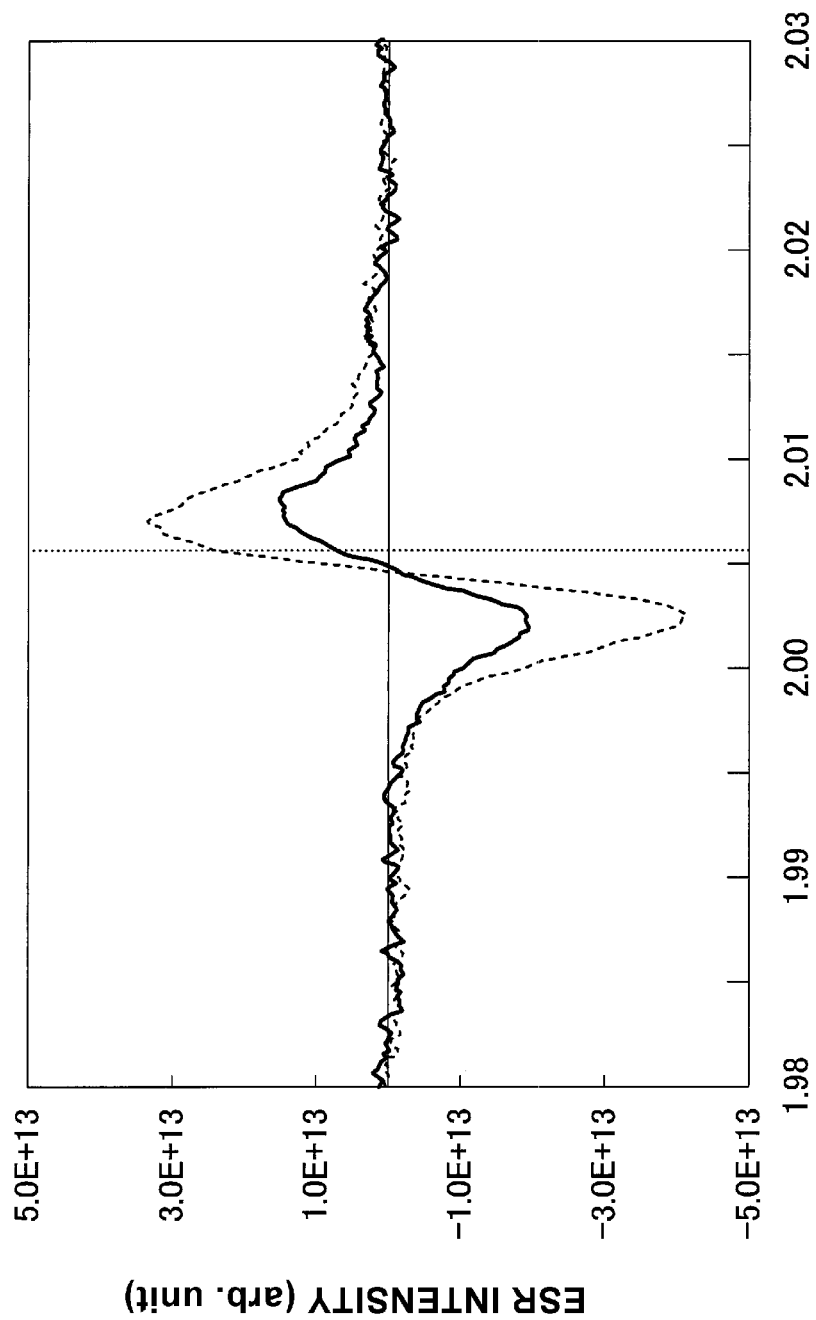
FIG. 8 illustrates defect densities of a film of the substrate before and after the substrate processing according to the embodiment.

FIG. 8 illustrates a defect density of the polysilicon film of the wafer processed by the substrate processing according to the embodiment and a defect density of the polysilicon film of the wafer according to a comparative example. The defect densities are analyzed by ESR (Electric Spin Resonance). The ESR is used to evaluate the defect density in the polysilicon film by measuring the magnetic resonance of the electron spins. The vertical axis of FIG. 8 represents an ESR intensity (i.e., the magnitude of the absorption) and the horizontal axis of FIG. 8 represents intensity of the magnetic field. In FIG. 8, a graph indicated by the solid line ("EMBODIMENT") represents the result of analyzing the polysilicon film formed on the wafer after performing the substrate processing according to the embodiment, and a graph indicated by the broken line ("COMPARATIVE EXAMPLE") represents the result of analyzing the polysilicon film formed on the wafer before performing the substrate processing according to the embodiment, as the comparative example.

As shown in FIG. 8, comparing the polysilicon film according to the embodiment with the polysilicon film according to the comparative example, the signal due to the defect detected from the polysilicon film after the substrate processing of the embodiment is smaller than that of the comparative example. Thus, compared with the defect density of the polysilicon film of the comparative example, the defect density of the polysilicon film after the substrate processing of the embodiment is decreased. That is, the polysilicon film is modified by the plasma process of the embodiment. It is possible to improve the defect density of the polysilicon film by filling defects of the polysilicon film with hydrogen atoms added by the substrate processing of the embodiment.

Figure 9:
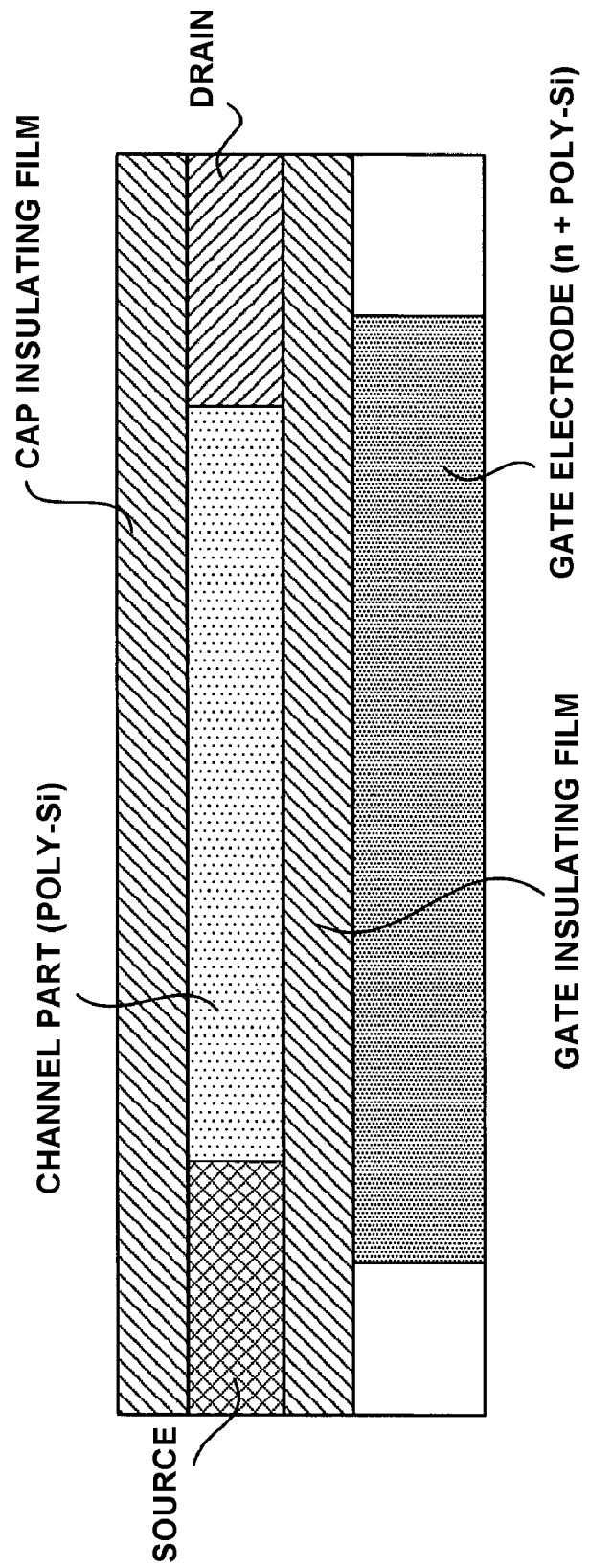
FIG. 9 illustrates a sample used for evaluating the electrical characteristics.
Figure 10A:
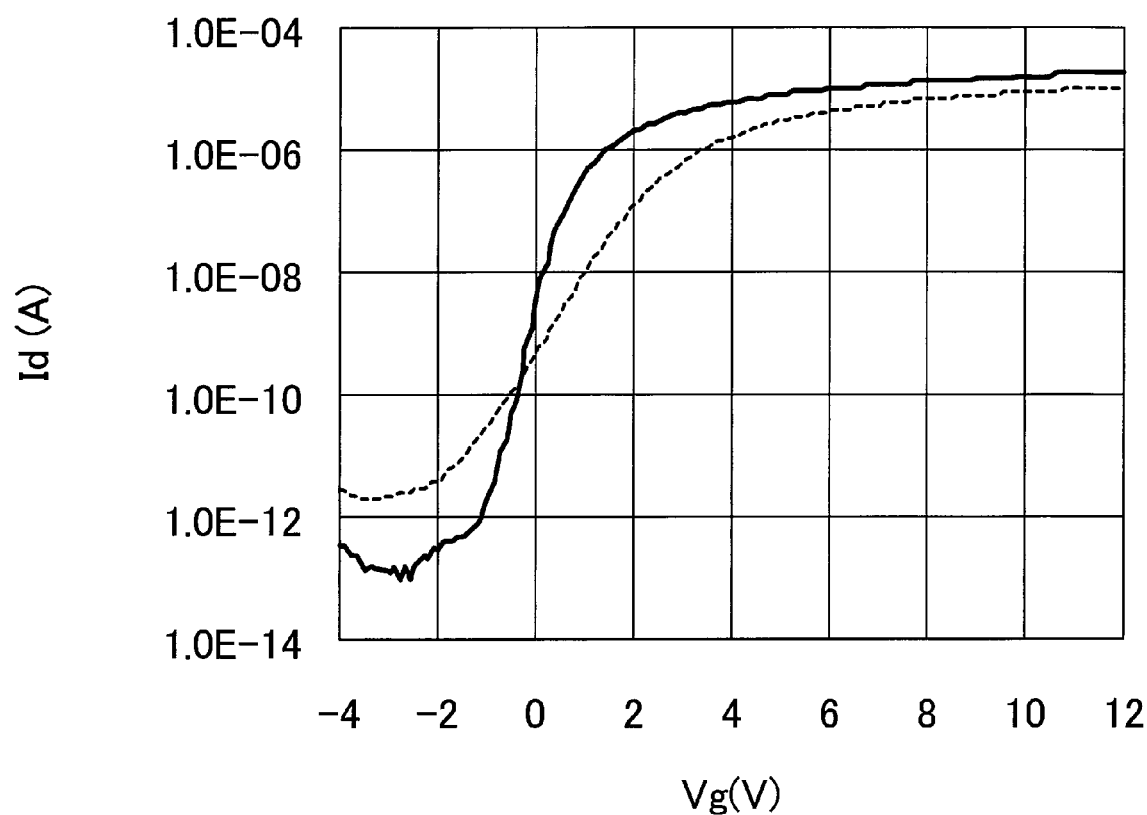
Figure 11:
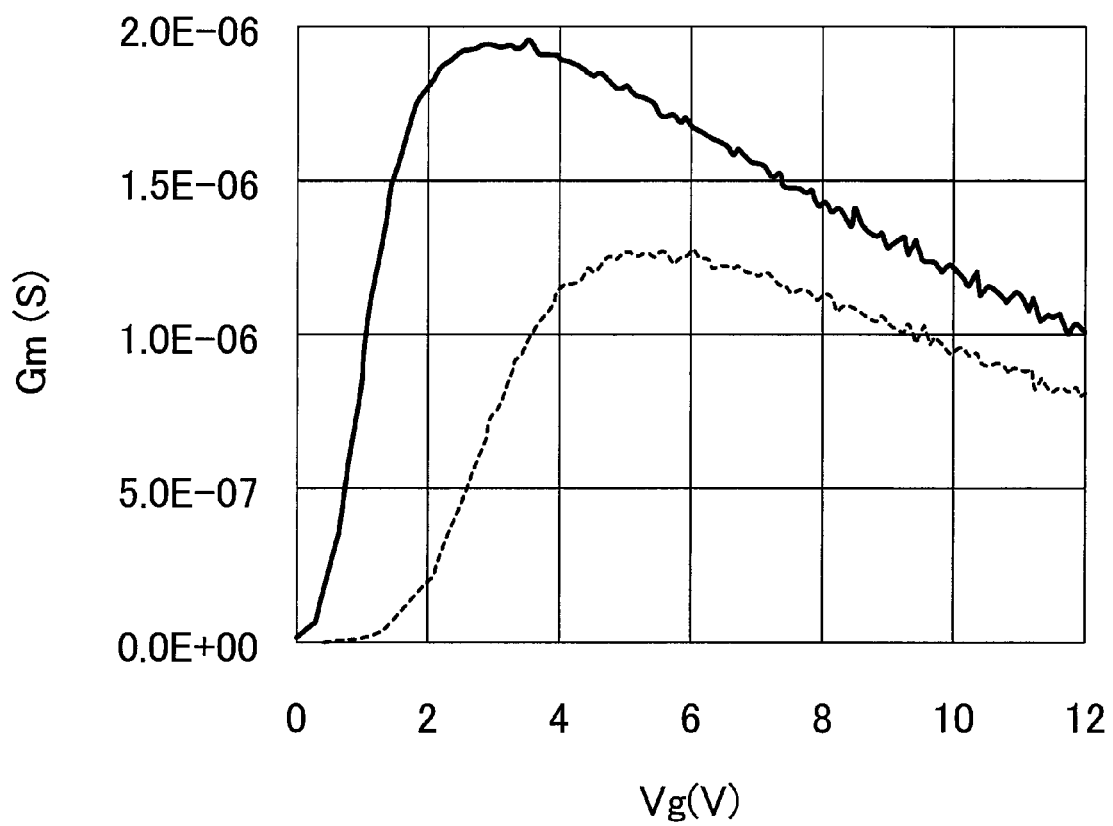
FIG. 11 illustrates evaluation results of the electrical characteristics obtained using the sample shown in FIG. 9.

Next, electrical characteristics of a transistor manufactured using the substrate processing according to the embodiment are evaluated. FIG. 9 illustrates a sample used for evaluating the electrical characteristics. The structure of the sample is similar to a 3D-NAND structure. After forming a gate insulating film, a polysilicon film is deposited as a channel part. The polysilicon film as the channel part is processed by plasma according to the substrate processing of the embodiment using the mixed gas of the $H_2$ gas and the $O_2$ gas. FIGS. 10A, 10B and 11 illustrate evaluation results of the electrical characteristics obtained using the sample shown in FIG. 9. In FIGS. 10A, 10B and 11, the solid lines ("EMBODIMENT" in FIGS. 10A, 10B and 11) represent the electrical characteristics of the sample after the substrate processing according to the embodiment. The broken lines ("COMPARATIVE EXAMPLE" in FIGS. 10A, 10B and 11) represent the electrical characteristics of the sample before the substrate processing according to the embodiment, as a comparative example. FIG. 10 illustrates the Id-Vg characteristics of the sample shown in FIG. 9. The vertical axes ("Id") of FIGS. 10A and 10B represent the current (drain current) flowing from a drain to a source shown in FIG. 9 and the horizontal axes ("Vg") of FIGS. 10A and 10B represent the gate-source voltage (gate voltage). The vertical axis ("Gm") of FIG. 11 represents a ratio of the drain current to the change in the gate voltage and the horizontal axis ("Vg") of FIG. 11 represents the gate-source voltage (gate voltage).

As shown in FIG. 10A, the slope of the Id-Vg characteristics of the sample after the substrate processing according to the embodiment is steeper than that of the comparative example. This indicates that the amount of change in the drain current increases with the change in the gate voltage, therefore, it is possible to expect the transistor that operates faster than before. As shown in FIG. 10B, the current value (Id value) after the substrate processing according to the embodiment is larger than that of the comparative example.

Further, as shown in FIG. 11, as compared with the evaluation result of the electrical characteristics according to the comparative example, the maximum of the Gm value is large and the maximum current value capable of operating becomes large.

(3) Effects According to the Embodiment

According to the embodiment, one or more advantageous effects described below are provided.

(A) According to the embodiment, it is possible to improve the electrical characteristics of the polysilicon film by performing the plasma process using hydrogen atoms to the polysilicon film. That is, by adding hydrogen atoms into the polysilicon film, it is possible to reduce the defect density in the polysilicon film and to increase the size of polysilicon particles. Thus, it is possible to improve the electron mobility in the polysilicon film and the electrical characteristics of the semiconductor device.

(B) According to the embodiment, by performing the plasma process using the gas containing hydrogen atoms and oxygen atoms to the polysilicon film, it is possible to suppress the damage to the underlying silicon oxide film serving as the base film (for example, the decrease of the oxygen components) and the penetration (diffusion) of the oxygen component into the polysilicon film. In addition, it is possible to suppress the excessive addition of hydrogen atoms to the underlying silicon oxide film serving as the base film. Therefore, even if the plasma process using the gas containing hydrogen atoms and oxygen atoms is performed after the silicon oxide film and the polysilicon film are formed sequentially, it is possible to add hydrogen atoms to the polysilicon film while suppressing unnecessary modification of the silicon oxide film and the polysilicon film. Thus, it is possible to improve the degree of freedom of the semiconductor device forming process.

(C) According to the embodiment, after the plasma process using the gas containing hydrogen atoms and oxygen atoms is performed, the plasma process using the nitrogen-containing gas is performed to nitride the surface of the polysilicon film. Thus, it is possible to suppress hydrogen atoms from being eliminated after modifying the polysilicon film using the plasma of the gas containing hydrogen atoms.

(D) According to the embodiment, it is possible to finally modify the polysilicon film applied to the NAND structure after each film is formed. Thus, it is possible to improve the degree of freedom of the semiconductor device forming process. Preferably, the thickness of the polysilicon film serving as the channel part is thin. When the thickness of the polysilicon film is thin, the damage to the underlying silicon oxide film serving as the base film becomes remarkable. Thus, the embodiment can be more preferably applied.

FIG. 12 schematically illustrates another exemplary cross-sectional view of a pattern formed on the substrate to be processed according to the substrate processing of the embodiment. As shown in FIG. 12, a silicon oxide film 300, a silicon nitride film 306, the silicon oxide film 300, and the polysilicon film 302 are stacked in this order on the wafer 200 from a contact surface of the wafer 200. Trenches 400 are formed on the wafer 200. It is possible to apply the substrate processing according to the embodiment to a structure (the pattern) as shown in FIG. 12 where a floating electrode formed by the polysilicon film 302 is formed on the tops of trenches 400. Specifically, it is possible to apply the substrate processing according to the embodiment to the structure where the trenches 400 having a high aspect ratio (for example, the aspect ratio of about 20 to 100 or more) are formed. That is, it is possible to form the silicon oxide film 300 as the base film of the floating electrode while suppressing the damage the underlying silicon oxide film 300 serving as the base film of the polysilicon film 302 and improving the electrical characteristics of the polysilicon film 302. That is, even when the substrate processing according to the embodiment is applied to the high aspect ratio structure described above, it is possible to uniformly (isotropically) process the polysilicon film serving as the channel part by plasma according to the embodiment. Thus, it is suitable for improving the characteristics of the semiconductor device including the high aspect ratio structure.

It is possible to apply the substrate processing according to the embodiment to a NAND structure where a control gate, a first insulating film, a trap layer (floating gate), a silicon oxide film serving as a second insulating film and a polysilicon film serving as a channel part are stacked on the wafer 200. According to the embodiment, it is possible to modify the polysilicon film finally after each film described above is formed. Thus, it is possible to improve the degree of freedom of the semiconductor device forming process. Preferably, the thickness of the polysilicon film serving as the channel part is thin. When the thickness of the polysilicon film is thin, the damage to the underlying silicon oxide film serving as the base film becomes remarkable. Thus, the embodiment can be more preferably applied.

While the technique is described in detail by way of the above-described embodiment, the above-described technique is not limited thereto. The above-described technique may be modified in various ways without departing from the gist thereof.

According to the technique described herein, it is possible to improve electrical characteristics of a polysilicon film while suppressing damage to an underlying silicon oxide film.

What is claimed is:

1. A method of manufacturing a semiconductor device, comprising:
  (a) preparing a substrate comprising a first silicon oxide film and a polysilicon film formed on the first silicon oxide film, wherein the polysilicon film comprises a contact surface contacting the first silicon oxide film and an exposed surface facing the contact surface;
  (b) supplying a reactive species generated by plasma excitation of a predetermined gas containing hydrogen and oxygen to the exposed surface of the polysilicon film such that: the reactive species supplied to the exposed surface of the polysilicon film reaches the contact surface and reacts with the polysilicon film and the first silicon oxide film; and hydrogen atoms contained in the reactive species are added to the polysilicon film, wherein the first silicon oxide film and the polysilicon film are formed on a side surface of an inner wall of a trench structure or a cylindrical structure formed on the substrate in a manner that the first silicon oxide film and the polysilicon film are sequentially stacked toward a center of the trench structure or the cylindrical structure; and (c) forming a second silicon oxide film on the polysilicon film after the polysilicon film is processed by the plasma.

2. A non-transitory computer-readable recording medium storing a program that causes, by a computer, a substrate processing apparatus to perform:

(a) preparing a substrate comprising a first silicon oxide film and a polysilicon film formed on the first silicon oxide film, wherein the polysilicon film comprises a contact surface contacting the first silicon oxide film and an exposed surface facing the contact surface;

(b) supplying a reactive species generated by plasma excitation of a predetermined gas containing hydrogen and oxygen to the exposed surface of the polysilicon film such that: the reactive species supplied to the exposed surface of the polysilicon film reaches the contact surface and reacts with the polysilicon film and the first silicon oxide film; and hydrogen atoms contained in the reactive species are added to the polysilicon film, wherein the first silicon oxide film and the polysilicon film are formed on a side surface of an inner wall of a trench structure or a cylindrical structure formed on the substrate in a manner that the first silicon oxide film and the polysilicon film are sequentially stacked toward a center of the trench structure or the cylindrical structure; and (c) forming a second silicon oxide film on the polysilicon film after the polysilicon film is processed by the plasma.

3. The method of claim 1, wherein the predetermined gas comprises a mixed gas of a hydrogen-containing gas and an oxygen-containing gas.

4. The method of claim 1, wherein the predetermined gas comprises a mixed gas of a hydrogen gas and an oxygen gas.

5. The method of claim 1, wherein a stacked structure is formed on the substrate by stacking a control gate, a first insulating film, a trap layer, the silicon oxide film serving as a second insulating film, and the polysilicon film serving as a channel part.

6. The method of claim 1, wherein a thickness of at least a part of the polysilicon film is equal to or less than 7 nm.

7. The method of claim 1, further comprising:

(c) supplying a nitrogen reactive species generated by exciting a gas containing nitrogen to the exposed surface of the polysilicon film after performing (b) such that the nitrogen reactive species reacts with the exposed surface of the polysilicon film and a silicon nitride film is formed on the polysilicon film.

8. The method of claim 1, wherein (a) comprises (a-1) loading the substrate into a process chamber having a plasma generation space where the predetermined gas is excited by plasma and placing the substrate at a position below a lower end of a coil provided at an outer peripheral portion of the process chamber, an electrical length of the coil being equal to an integral multiple of a wavelength of a high frequency power applied to the coil, and wherein (b) comprises:

(b-1) supplying the predetermined gas to the plasma generation space;

(b-2) exciting the predetermined gas in the plasma generation space by applying the high frequency power to the coil; and (b-3) controlling a frequency of the high frequency power applied to the coil so as to maintain a resonance state of the coil while (b-2) is performed.

9. The method of claim 1, wherein a ratio of hydrogen atoms to oxygen atoms in the predetermined gas ranges from 5:95 to 95:5.

10. The method of claim 4, wherein a volume ratio of the hydrogen gas and the oxygen gas in the mixed gas ranges from 5:95 to 95:5.

11. The method of claim 1, wherein a defect density of the polysilicon film is decreased after performing (b) compared with a defect density of the polysilicon film before performing (b).

12. The method of claim 1, wherein a size of polysilicon particles constituting the polysilicon film is increased after performing (b) compared with a size of polysilicon particles constituting the polysilicon film before performing (b).

13. The method of claim 1, wherein an electron mobility in the polysilicon film is increased after performing (b) compared with an electron mobility in the polysilicon film before performing (b).

14. The method of claim 1, wherein in (b), the reactive species are supplied to the exposed surface of the polysilicon film such that oxygen atoms contained in the reactive species reacts with the silicon oxide film and suppresses the hydrogen atoms contained in the reactive species from being added to the silicon oxide film.

15. The method of claim 1, wherein in (b), the reactive species are supplied to the exposed surface of the polysilicon film such that oxygen atoms contained in the reactive species reacts with the silicon oxide film and suppresses the hydrogen atoms contained in the reactive species from desorbing oxygen atoms in the silicon oxide film.

16. The method of claim 1, wherein the predetermined gas comprises an $H_2O$ gas.

17. The method of claim 1, wherein the predetermined gas consists of a mixed gas of a hydrogen gas, an oxygen gas, and an argon gas.

* * * * *